(12) United States Patent
Lee et al.

(10) Patent No.: US 8,273,270 B2
(45) Date of Patent: *Sep. 25, 2012

(54) PHOTOSENSITIVE RESIN COMPOSITION AND LIGHT BLOCKING LAYER USING THE SAME

(75) Inventors: Chang-Min Lee, Uiwang-si (KR); Kil-Sung Lee, Uiwang-si (KR); Jun-Seok Kim, Uiwang-si (KR); Jung-Sik Choi, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/161,542

(22) Filed: Jun. 16, 2011

(65) Prior Publication Data

US 2012/0091407 A1  Apr. 19, 2012

(30) Foreign Application Priority Data

Oct. 13, 2010  (KR) .................. 10-2010-0099926

(51) Int. Cl.
*G02B 5/23* (2006.01)
*C08F 2/50* (2006.01)
*C08F 2/46* (2006.01)
*C08J 3/28* (2006.01)
*G03F 7/033* (2006.01)
*G03F 7/032* (2006.01)

(52) U.S. Cl. ............ 252/586; 252/582; 430/270.1; 430/281.1; 430/286.1; 430/287.1; 430/293; 522/71; 522/74; 522/79; 522/80; 522/81; 522/101; 522/103; 522/104; 522/113; 522/120; 522/123; 522/149; 522/153; 522/154; 522/178; 522/182; 522/183; 524/99

(58) Field of Classification Search ......... 252/586, 252/582; 430/7, 270.1, 281.1, 286.1, 287.1, 430/293; 522/33, 42, 46, 53, 63, 78, 79, 522/182, 71, 74, 80, 81, 101, 103, 104, 113, 522/120, 123, 149, 153, 154, 178, 183; 524/99

See application file for complete search history.

(56) References Cited

U.S. PATENT DOCUMENTS

| | | | |
|---|---|---|---|
| 4,500,897 A | 2/1985 | Matsuda et al. | |
| 4,762,752 A | 8/1988 | Haubennestel et al. | |
| 5,424,167 A | 6/1995 | Uetani et al. | |
| 5,707,432 A | 1/1998 | Adams et al. | |
| 5,708,055 A | 1/1998 | Joyce et al. | |
| 5,710,234 A | 1/1998 | Fujishiro et al. | |
| 5,721,076 A * | 2/1998 | Watanabe et al. | 430/7 |
| 5,803,959 A | 9/1998 | Johnson et al. | |
| 5,851,280 A | 12/1998 | Belmont et al. | |

(Continued)

FOREIGN PATENT DOCUMENTS
CN  1606597  4/2005
(Continued)

OTHER PUBLICATIONS

Office Action in commonly owned U.S. Appl. No. 11/473,876, mailed on Dec. 18, 2008, pp. 1-14. Notice of Allowance in commonly owned U.S. Appl. No. 11/473,876, mailed on Jul. 17, 2009, pp. 1-6.
International Search Report in commonly owned International Application No. PCT/KR2007/002908, dated Sep. 21, 2007, pp. 1-2.
English Translation of Abstract for Korean Patent Application No. 92-702502.
English Translation of Abstract for Korean Patent Application No. 93-700858.
English Translation of Abstract for Korean Patent Application No. 94-7778.
English Translation of Abstract for Korean Patent Application No. 95-11163.
English Translation of Abstract for Korean Patent Application No. 95-700359.
English Translation of Abstract for Korean Patent Application No. 95-703746.
English Translation of Abstract for Korean Patent Application No. 96-11513.

(Continued)

*Primary Examiner* — Bijan Ahvazi
(74) *Attorney, Agent, or Firm* — Summa, Additon & Ashe, P.A.

(57) ABSTRACT

Disclosed are a photosensitive resin composition that includes (A) a cardo-based resin including repeating units represented by the following Chemical Formulae 1 and 2, wherein the substituents of Chemical Formulae 1 and 2 are the same as defined in the specification, (B) reactive unsaturated compound, (C) a pigment, (D) an initiator, and (E) a solvent, and a light blocking layer using the photosensitive resin composition.

[Chemical Formula 1]

[Chemical Formula 2]

13 Claims, 9 Drawing Sheets

U.S. PATENT DOCUMENTS

| | | | |
|---|---|---|---|
| 5,895,522 | A | 4/1999 | Belmont et al. |
| 5,922,118 | A | 7/1999 | Johnson et al. |
| 5,968,243 | A | 10/1999 | Belmont et al. |
| 6,110,994 | A | 8/2000 | Cooke et al. |
| 6,232,025 | B1 | 5/2001 | Srinivasan |
| 6,277,183 | B1 | 8/2001 | Johnson et al. |
| 6,328,894 | B1 | 12/2001 | Chan et al. |
| 6,780,389 | B2 | 8/2004 | Karl et al. |
| 6,960,250 | B2 | 11/2005 | Luethge et al. |
| 7,132,154 | B2 | 11/2006 | Shibahara et al. |
| 7,250,209 | B2 | 7/2007 | Shibahara et al. |
| 7,376,328 | B2 | 5/2008 | Takase et al. |
| 7,592,119 | B2 | 9/2009 | Nomura |
| 7,794,917 | B2 | 9/2010 | Mori et al. |
| 2002/0187412 | A1 | 12/2002 | You et al. |
| 2004/0126592 | A1 | 7/2004 | Shibahara et al. |
| 2005/0164120 | A1 | 7/2005 | Yamaoka et al. |
| 2006/0041053 | A1 | 2/2006 | Kamata et al. |
| 2007/0101903 | A1 | 5/2007 | Lee et al. |
| 2007/0161110 | A1 | 7/2007 | Iida et al. |
| 2008/0090177 | A1 | 4/2008 | Oh et al. |
| 2009/0207490 | A1 | 8/2009 | Moriyama et al. |
| 2010/0085518 | A1 | 4/2010 | Choi et al. |
| 2010/0163811 | A1* | 7/2010 | Oh et al. ............. 252/586 |
| 2010/0227178 | A1 | 9/2010 | Oouchi et al. |

FOREIGN PATENT DOCUMENTS

| | | |
|---|---|---|
| CN | 1606600 | 4/2005 |
| EP | 1471112 A1 | 10/2004 |
| JP | 60237403 | 11/1985 |
| JP | 1152449 | 6/1989 |
| JP | 1200353 | 8/1989 |
| JP | 4007373 | 1/1992 |
| JP | 4091173 | 3/1992 |
| JP | 4163552 | 6/1992 |
| JP | 05-339356 A | 12/1993 |
| JP | 06-001938 A | 1/1994 |
| JP | 07-064281 A | 3/1995 |
| JP | 07-64282 | 3/1995 |
| JP | 08-278630 A | 10/1996 |
| JP | 09-022653 A | 1/1997 |
| JP | 09-291224 | 11/1997 |
| JP | 09-304929 | 11/1997 |
| JP | 10-010311 A | 1/1998 |
| JP | 10-067970 | 3/1998 |
| JP | 10-204321 A | 8/1998 |
| JP | 10218973 A | 8/1998 |
| JP | 10-253820 A | 9/1998 |
| JP | 10-510861 | 10/1998 |
| JP | 11-060989 A | 3/1999 |
| JP | 11-231523 | 8/1999 |
| JP | 2000-056120 | 2/2000 |
| JP | 2000-171969 A | 6/2000 |
| JP | 2001-131241 | 5/2001 |
| JP | 2002-145999 | 5/2002 |
| JP | 3287661 B2 | 6/2002 |
| JP | 2003-066597 | 3/2003 |
| JP | 2003-149810 | 5/2003 |
| JP | 2004-004762 A | 1/2004 |
| JP | 2004-029745 A | 1/2004 |
| JP | 2004-186227 | 7/2004 |
| JP | 2004-198717 A | 7/2004 |
| JP | 2004-251946 A | 9/2004 |
| JP | 2004-292672 A | 10/2004 |
| JP | 2004-075985 A | 11/2004 |
| JP | 2005-215149 | 8/2005 |
| KR | 1019910004717 | 7/1991 |
| KR | 1019920005780 | 7/1992 |
| KR | 1019940005617 | 6/1994 |
| KR | 94-7778 | 8/1994 |
| KR | 10-1995-7002313 | 6/1995 |
| KR | 95-11163 | 9/1995 |
| KR | 95-7003746 | 9/1995 |
| KR | 96-11513 | 1/1999 |
| KR | 93-700858 | 7/2000 |
| KR | 10-0264691 A | 9/2000 |
| KR | 95-700359 | 1/2001 |
| KR | 92-702502 | 12/2002 |
| KR | 2003-057090 | 7/2003 |
| KR | 96-29904 | 5/2004 |
| KR | 10-2006-0041154 A | 5/2006 |
| KR | 10-2006-0070772 A | 6/2006 |
| KR | 10-2006-0076412 A | 7/2006 |
| KR | 10-0725023 B1 | 5/2007 |
| KR | 10-2009-0026037 A | 3/2009 |
| KR | 10-2010-0047648 A | 5/2010 |
| KR | 10-2010-0053090 A | 5/2010 |
| KR | 10-2010-0053476 A | 5/2010 |
| WO | 2004/055597 A1 | 7/2004 |
| WO | 2006/044676 A2 | 4/2006 |
| WO | 2008/047992 A1 | 4/2008 |
| WO | 2010/050650 A1 | 5/2010 |

OTHER PUBLICATIONS

English Translation of Abstract for Korean Patent Application No. 96-29904.
Machine Translation of JP 07064282 A, pp. 1-23.
Machine Translation of KR 2003057090 A, pp. 1-14.
Office Actiuon in commonly owned copending U.S. Appl. No. 12/323,554, mailed on Jun. 24, 2009, pp. 1-25.
English abstract of JP 2004-292672, published Oct. 21, 2004, pp. 1-3.
English abstract of JP 10-204321, published Aug. 4, 1998, pp. 1-3.
English abstract of JP 2004-251946, published Sep. 9, 2004, pp. 1-4.
English abstract of JP 2004-029745, published Jan. 29, 2004, pp. 1-4.
English abstract of JP 2004-004762, published Jan. 8, 2004, pp. 1-4.
English abstract of JP 2004-075985, published Mar. 11, 2004, pp. 1-5.
English abstract of JP 2004-198717, published Jul. 15, 2004, pp. 1-6.
English abstract of JP 10-253820, published Sep. 25, 1998, pp. 1-3.
English abstract of JP 10-010311, published Jan. 16, 1998, pp. 1-3.
English abstract of JP 11-060989, published Mar. 5, 1999, pp. 1-2.
English abstract of JP 09-022653, published Jan. 21, 1997, pp. 1-2.
Office Action in commonly owned U.S. Appl. No. 11/747,313 mailed Jun. 13, 2011, pp. 1-6.
Office Action in commonly owned U.S. Appl. No. 11/747,313 mailed Nov. 23, 2011, pp. 1-6.
Office Action in commonly owned U.S. Appl. No. 11/747,313 mailed Dec. 22, 2010, pp. 1-4.
Office Action in commonly owned U.S. Appl. No. 12/504,409 mailed on Nov. 18, 2010, pp. 1-12.
Taiwanese Office Action in commonly owned Taiwanese Application No. 095144145 dated Jun. 4, 2010, pp. 1-5.
English translation of Taiwanese Search Report in commonly owned Taiwanese Application No. 095144145 dated May 11, 2010, pp. 1.
Office Action in commonly owned U.S. Appl. No. 12/323,554 mailed Dec. 29, 2009, pp. 1-18.
Office Action in commonly owned U.S. Appl. No. 13/217,581 mailed Jan. 6, 2012, pp. 1-16.
Office Action in commonly owned U.S. Appl. No. 13/241,434 mailed Jan. 23, 2012, pp. 1-19.

* cited by examiner

PHOTOSENSITIVE RESIN COMPOSITION AND LIGHT BLOCKING LAYER USING THE SAME

CROSS-REFERENCE TO RELATED APPLICATION

This application claims priority to and the benefit of Korean Patent Application No. 10-2010-0099926 filed in the Korean Intellectual Property Office on Oct. 13, 2010, the entire disclosure of which is incorporated herein by reference.

FIELD OF THE INVENTION

The present invention relates to a photosensitive resin composition and a light blocking layer using the same.

BACKGROUND

A liquid crystal display device includes a lower substrate including a light blocking layer, a color filter, and an ITO pixel electrode; an active circuit portion including a liquid crystal layer, a thin film transistor, and a capacitor layer; and an upper substrate including an ITO pixel electrode.

The light blocking layer blocks uncontrolled light transmitted out of a transparent pixel electrode of a substrate and thus prevents contrast reduction due to light transmitted through a thin film transistor. Red, green and blue light blocking layers transmit light with a predetermined wavelength of white light and display colors.

The light blocking layer is generally fabricated using a pigment dispersion method. The pigment dispersion method includes coating a transparent substrate with a colorant-containing photopolymerizable composition, exposing the coating to provide a pattern by thermal curing, and removing non-exposed portions with a solvent.

High heat resistance may be obtained when a photosensitive polyimide or phenol-based resin is used as a binder resin in the pigment dispersion method. Sensitivity, however, may be lowered and an organic solvent is required as a development solvent.

A photoresist using an azide compound can also be used in a pigment-dispersion method. Such a photoresist, however, can have low sensitivity and heat resistance and may be affected by oxygen during exposure.

Acrylic-based resins can have good heat resistance, shrinkage-resistance, chemical resistance, and the like, but also can have reduced sensitivity, development property, and close contacting (adhesive) properties. In addition, a large amount of black pigment is typically included to adjust optical density of a light blocking layer, which can significantly deteriorate sensitivity, development properties, and close contacting properties.

SUMMARY

The present invention provides a photosensitive resin composition that can have excellent sensitivity, development properties, close contacting (adhesive) properties, heat resistance, shrinkage-resistance, chemical resistance, and/or taper properties.

The present invention also provides a light blocking layer fabricated using the photosensitive resin composition.

The photosensitive resin composition of the invention includes (A) a cardo-based resin including repeating units represented by the following Chemical Formulae 1 and 2; (B) a reactive unsaturated compound; (C) a pigment; (D) an initiator; and (E) a solvent.

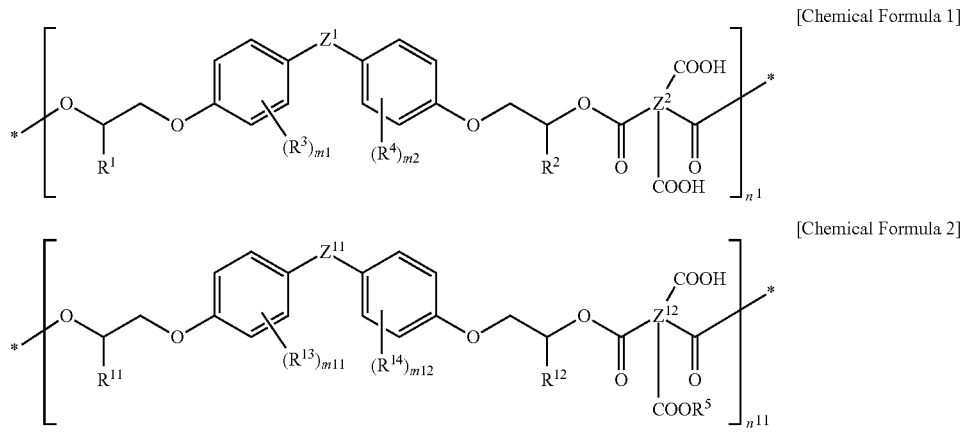

[Chemical Formula 1]

[Chemical Formula 2]

In Chemical Formulae 1 and 2, $R^3$, $R^4$, $R^{13}$, and $R^{14}$ are the same or different and are independently hydrogen, halogen, or substituted or unsubstituted C1 to C20 alkyl, $R^1$ and $R^2$ are the same or different and are independently hydrogen or substituted or unsubstituted (meth)acrylate, $R^{11}$ and $R^{12}$ are the same or different and are independently substituted or unsubstituted (meth)acrylate, $R^5$ is a substituent including an ethylenic double bond, $Z^1$ and $Z^{11}$ are the same or different and are independently a single bond, O, CO, $SO_2$, $CR^6R^7$, $SiR^8R^9$ (wherein $R^6$ to $R^9$ are the same or different and are independently hydrogen or substituted or unsubstituted C1 to C20 alkyl), or at least one of the linking groups represented by the following Chemical Formulae 3-1 to 3-11, $Z^2$ and $Z^{12}$ are the same or different and are independently acid anhydride residual group or acid dianhydride residual group, $m^1$, $m^2$, $m^{11}$, and $m^{12}$ are independently integers ranging from 0 to 4, and $n^1$ and $n^{11}$ independently range from 1 to 30.

[Chemical Formula 3-1]

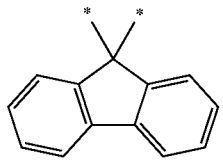

[Chemical Formula 3-2]

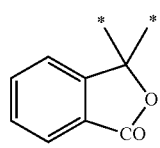

[Chemical Formula 3-3]

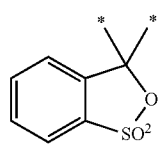

[Chemical Formula 3-4]

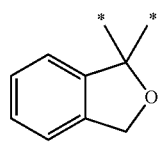

[Chemical Formula 3-5]

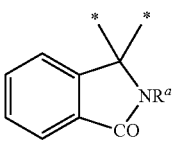

In Chemical Formula 3-5, $R^a$ is hydrogen, ethyl, $C_2H_4Cl$, $C_2H_4OH$, $CH_2CH=CH_2$, or phenyl.

[Chemical Formula 3-6]

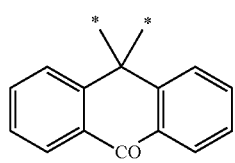

[Chemical Formula 3-7]

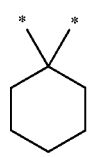

[Chemical Formula 3-8]

[Chemical Formula 3-9]

[Chemical Formula 3-10]

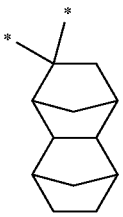

[Chemical Formula 3-11]

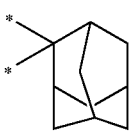

In Chemical Formula 2 above, $R^5$ can be a substituent represented by the following Chemical Formula 4-1 or 4-2.

[Chemical Formula 4-1]

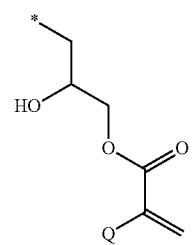

In Chemical Formula 4-1,

Q is hydrogen or substituted or unsubstituted C1 to C20 alkyl.

[Chemical Formula 4-2]

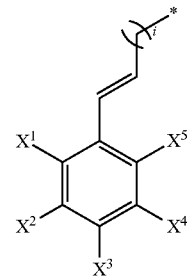

In Chemical Formula 4-2, $X^1$ to $X^5$ are the same or different and are independently hydrogen, halogen, substituted or unsubstituted C1 to C20 alkyl, substituted or unsubstituted C6 to C30 aryl, substituted or unsubstituted amine, or substituted or unsubstituted C1 to C20 alkoxy, and i is an integer ranging from 0 to 5.

$n^1$ of the repeating unit represented by Chemical Formula 1 and $n^{11}$ of the repeating unit represented by Chemical Formula 2 may be present at a mole ratio of about 1:99 to about 99:1.

The cardo-based resin may have a weight average molecular weight of about 500 to about 50,000 g/mol.

The cardo-based resin may include a terminal group represented by the following Chemical Formula 5 at least one of both terminal ends.

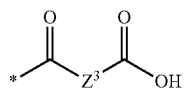

[Chemical Formula 5]

In Chemical Formula 5, $Z^3$ is at least one of linking groups represented by the following Chemical Formulae 6-1 to 6-7.

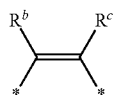

[Chemical Formula 6-1]

In Chemical Formula 6-1, $R^b$ and $R^c$ are the same or different and are independently hydrogen, substituted or unsubstituted C1 to C20 alkyl, ester, or ether.

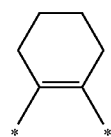

[Chemical Formula 6-2]

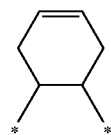

[Chemical Formula 6-3]

[Chemical Formula 6-4]

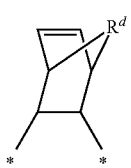

[Chemical Formula 6-5]

In Chemical Formula 6-5, $R^d$ is O, S, NH, substituted or unsubstituted C1 to C20 alkyl, C1 to C20 alkylamine, or C2 to C20 allylamine.

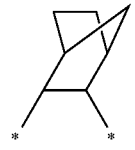

[Chemical Formula 6-6]

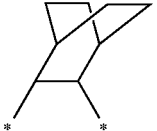

[Chemical Formula 6-7]

The photosensitive resin composition may include about 1 to about 30 wt % of the cardo-based resin (A); about 1 to about 40 wt % of the reactive unsaturated compound (B); about 1 to about 30 wt % of the pigment (C); about 0.01 to about 10 wt % of the initiator (D); and balance of the solvent (E).

The photosensitive resin composition may further include an acrylic-based resin. Exemplary acrylic-based resins may include a copolymer of a first ethylenic unsaturated monomer including (meth)acrylic acid, maleic acid, itaconic acid, fumaric acid, or a combination thereof; and a second ethylenic unsaturated monomer including styrene, α-methylstyrene, vinyltoluene, vinylbenzylmethylether, methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, 2-aminoethyl(meth)acrylate, 2-dimethylaminoethyl(meth)acrylate, vinyl acetate, vinyl benzoate, glycidyl(meth)acrylate, (meth)acrylonitrile, (meth)acrylamide, or a combination thereof.

The acrylic-based resin may have a weight average molecular weight of about 3,000 to about 40,000 g/mol.

The cardo-based resin and acrylic-based resin may be included at a weight ratio of about 99:1 to about 30:70.

The initiator may include a photopolymerization initiator, a radical polymerization initiator, or a combination thereof.

The photosensitive resin composition may further include about 0.01 to about 20 parts by weight of an epoxy compound, based on 100 parts by weight of the photosensitive resin composition.

The present invention further provides a light blocking layer manufactured using the photosensitive resin composition.

Hereinafter, other embodiments will be described in detail.

The photosensitive resin composition can have excellent sensitivity, development properties, close contacting properties, heat resistance, shrinkage-resistance, chemical resistance, and/or taper properties and may be useful as a light blocking layer, and the like.

DETAILED DESCRIPTION

Figure 1:
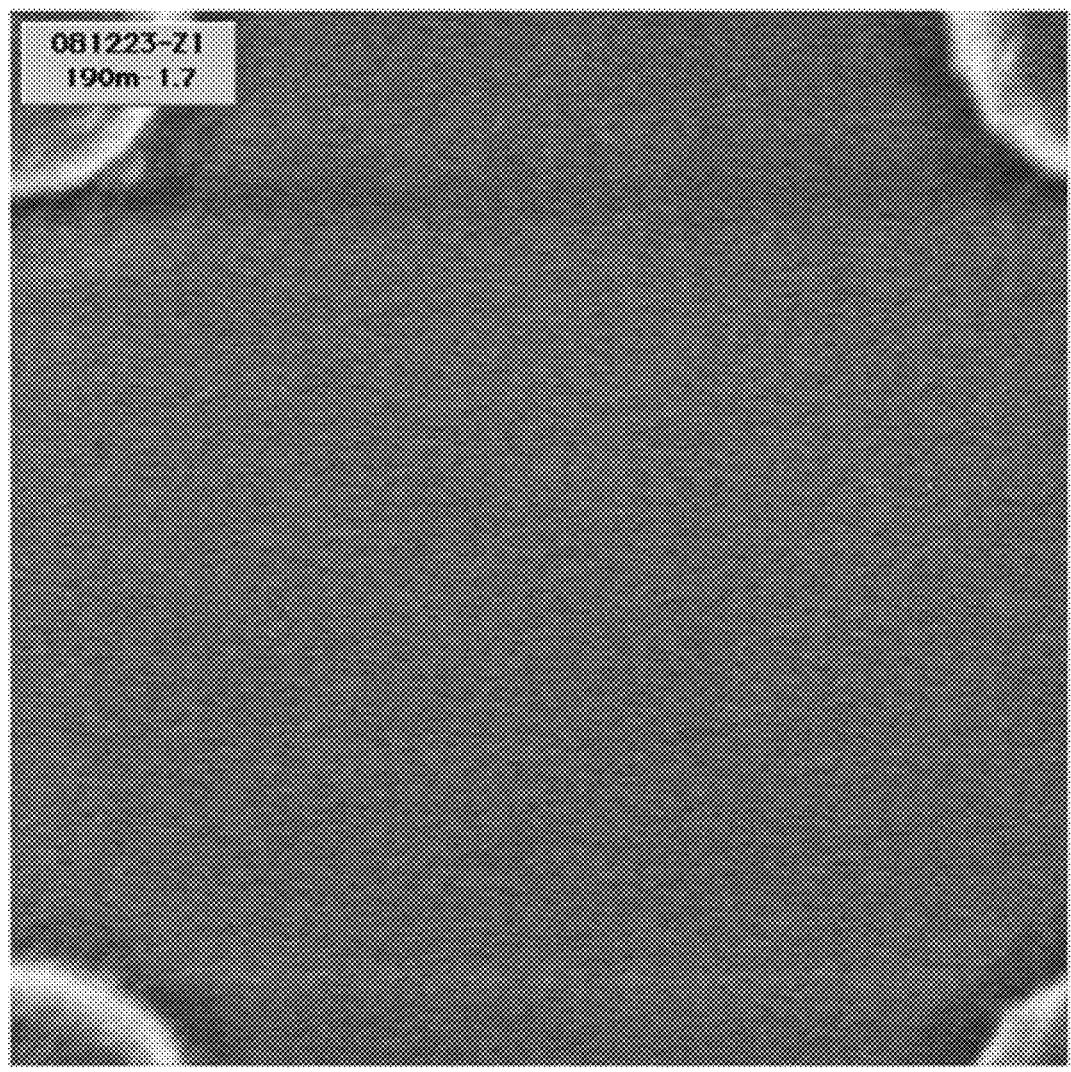
FIG. 1 is a scanning electron microscope photograph showing residue of the photosensitive resin composition according to Example 1.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to a halogen (F, Cl, Br or I), a hydroxyl group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof, replacing a corresponding number of hydrogen atoms.

As used herein, when a specific definition is not otherwise provided, the term "hetero" refers to one or more heteroatoms including N, O, S, P, or a combination thereof, replacing a corresponding number of hydrogen atoms in a cyclic group.

As used herein, when a specific definition is not otherwise provided, the term "(meth)acrylate" refers to both "acrylate" and "methacrylate", and the term "(meth)acrylic acid" refers to "acrylic acid" and "methacrylic acid".

The photosensitive resin composition according to one embodiment includes (A) a cardo-based resin, (B) a reactive unsaturated compound, (C) a pigment, (D) an initiator, and (E) a solvent.

Hereinafter, each component is described in detail.

(A) Cardo-Based Resin

The cardo-based resin includes repeating units represented by the following Chemical Formulae 1 and 2.

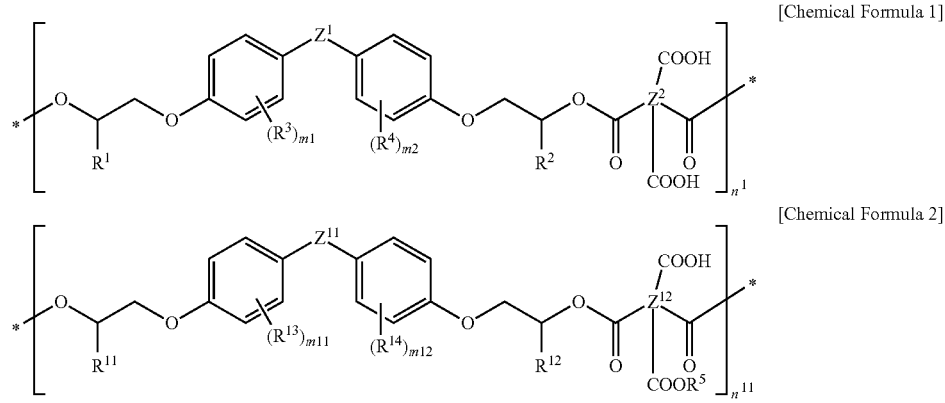

[Chemical Formula 1]

[Chemical Formula 2]

In Chemical Formulae 1 and 2, $R^3$, $R^4$, $R^{13}$ and $R^{14}$ are the same or different and are independently hydrogen, halogen, or substituted or unsubstituted C1 to C20 alkyl, $R^1$ and $R^2$ are the same or different and are independently hydrogen or substituted or unsubstituted (meth)acrylate, each $R^{11}$ and $R^{12}$ are the same or different and are independently substituted or unsubstituted (meth)acrylate, $R^5$ is a substituent including an ethylenic double bond, $Z^1$ and $Z^{11}$ are the same or different and are independently a single bond, O, CO, $SO_2$, $CR^6R^7$, $SiR^8R^9$ (wherein $R^6$ to $R^9$ are the same or different and are independently hydrogen or substituted or unsubstituted C1 to C20 alkyl), or at least one of linking groups represented by the following Chemical Formulae 3-1 to 3-11, $Z^2$ and $Z^{12}$ are the same or different and are independently an acid anhydride residual group or an acid dianhydride residual group, $m^1$, $m^2$, $m^{11}$ and $m^{12}$ are independently integers ranging from 0 to 4, and $n^1$ and $n^{11}$ independently range from 1 to 30.

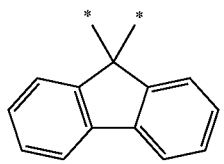

[Chemical Formula 3-1]

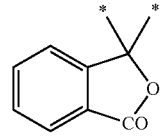

[Chemical Formula 3-2]

[Chemical Formula 3-3]

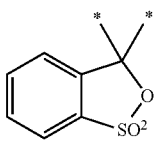

[Chemical Formula 3-4]

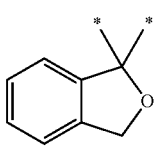

[Chemical Formula 3-5]

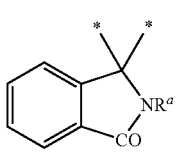

In Chemical Formula 3-5, $R^a$ is hydrogen, ethyl, $C_2H_4Cl$, $C_2H_4OH$, $CH_2CH=CH_2$, or phenyl.

[Chemical Formula 3-6]

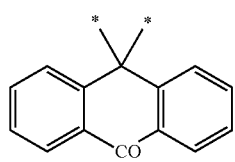

[Chemical Formula 3-7]

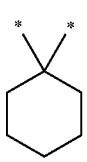

[Chemical Formula 3-8]

[Chemical Formula 3-9]

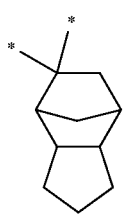

[Chemical Formula 3-10]

[Chemical Formula 3-11]

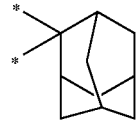

The repeating unit represented by the above Chemical Formula 2 includes (meth)acrylate at positions of $R^{11}$ and $R^{12}$ and also an ethylenic double bond at a $R^5$ position. Since the cardo-based resin includes double bonds at three positions ($R^{11}$, $R^{12}$, and $R^5$), the photosensitive resin composition including the same may have excellent compatibility, development properties, sensitivity, close contacting properties, and/or mechanical strength. In addition, the photosensitive resin composition may have excellent heat resistance and/or light resistance and thus can be used in high temperature applications.

$Z^2$ and $Z^{12}$ are independently derived from an acid anhydride or an acid dianhydride. Examples of acid anhydride and acid dianhydride compounds include without limitation benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthacid anhydride, and the like, and combinations thereof.

$R^5$ in the above Chemical Formula 2 may be substituents represented by the following Chemical Formulae 4-1 or 4-2, but is not limited thereto.

[Chemical Formula 4-1]

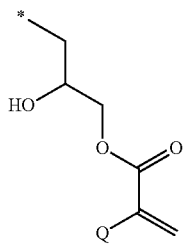

In Chemical Formula 4-1,

Q is hydrogen or substituted or unsubstituted C1 to C20 alkyl.

[Chemical Formula 4-2]

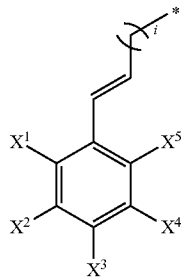

In Chemical Formula 4-2, $X^1$ to $X^5$ are the same or different and are independently hydrogen, halogen, substituted or unsubstituted C1 to C20 alkyl, substituted or unsubstituted C6 to C30 aryl, substituted or unsubstituted amine, or substituted or unsubstituted C1 to C20 alkoxy, and i is an integer ranging from 0 to 5.

$n^1$ of the repeating unit represented by Chemical Formula 1 and $n^{11}$ of the repeating unit represented by Chemical Formula 2 may be present at a mole ratio of about 1:99 to about 99:1, for example about 30:70 to about 70:30.

In some embodiments, the repeating unit represented by Chemical Formula 1 may be present in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60; 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 mole percent. Further, according to some embodiments of the present invention, the amount of the repeating unit represented by Chemical Formula 1 can be in a range from any of the foregoing amounts to about any other of the foregoing amounts.

In some embodiments, the repeating unit represented by Chemical Formula 2 may be present in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 mole percent. Further, according to some embodiments of the present invention, the amount of the repeating unit represented by Chemical Formula 2 can be in a range from any of the foregoing amounts to about any other of the foregoing amounts.

When $n^1$ and $n^{11}$ are present at the above mole ratio, development properties and sensitivity at curing can be excellent, which can result in fine pattern-forming properties.

The cardo-based resin may include a terminal group represented by the following Chemical Formula 5 at least one of both terminal ends.

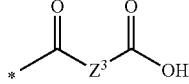

[Chemical Formula 5]

In Chemical Formula 5, $Z^3$ is at least one of linking groups represented by the following Chemical Formulae 6-1 to 6-7.

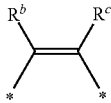

[Chemical Formula 6-1]

In Chemical Formula 6-1, $R^b$ and $R^c$ are the same or different and are independently hydrogen, substituted or unsubstituted C1 to C20 alkyl, ester, or ether.

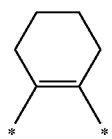

[Chemical Formula 6-2]

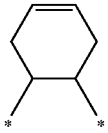

[Chemical Formula 6-3]

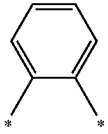

[Chemical Formula 6-4]

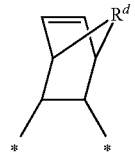

[Chemical Formula 6-5]

In Chemical Formula 6-5, $R^d$ is O, S, NH, substituted or unsubstituted C1 to C20 alkyl, C1 to C20 alkylamine, or C2 to C20 allylamine.

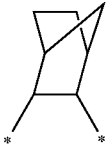

[Chemical Formula 6-6]

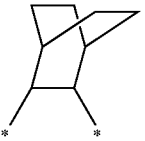

[Chemical Formula 6-7]

Examples of the cardo-based resin may include without limitation two or more of a fluorene-containing compound such as 9,9-bis(4-oxiranylmethoxyphenyl)fluorene, and the like; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthacid anhydride, and the like; a glycol compound such as ethyleneglycol, propyleneglycol, polyethyleneglycol, and the like; an alcohol compound such as methanol, ethanol, propanol, n-butanol, cyclohexanol, benzylalcohol, and the like; a solvent compound such as propylene glycol methyl ether acetate, N-methylpyrrolidone, and the like; a phosphorus compound such as triphenylphosphine, and the like; and an amine or ammonium salt compound such as tetramethylammonium chloride, tetraethylammonium bromide, benzyldiethylamine, triethylamine, tributylamine, benzyltriethylammonium chloride, and the like, as well as combinations thereof.

The cardo-based resin may have a weight average molecular weight of about 500 to about 50,000 g/mol, for example about 1,000 to about 30,000 g/mol. When the cardo-based resin has a weight average molecular weight within these ranges, during manufacture of a light blocking layer, a pattern can be formed with minimal or no residue, and there may be minimal or no loss of film thickness during development, resulting in a good pattern.

The photosensitive resin composition may include the cardo-based resin in an amount of about 1 to about 30 wt %, for example about 3 to about 20 wt %, based on the total weight of the photosensitive resin composition. In some embodiments, the photosensitive resin composition may include the cardo-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt. %. Further: according to some embodiments of the present invention, the amount of the cardo-based resin can be in a range from any of the foregoing amounts to about any other of the foregoing amounts. When the cardo-based resin is included in an amount within these ranges, excellent sensitivity, development properties, and close contacting properties may be realized.

The photosensitive resin composition may further include an acrylic-based resin in addition to the cardo-based resin.

The acrylic-based resin can be a copolymer of a first ethylenic unsaturated monomer and a second ethylenic unsaturated monomer that is copolymerizable with the first ethylenic unsaturated monomer, and a resin including at least one acrylic-based repeating unit.

The first ethylenic unsaturated monomer is an ethylenic unsaturated monomer including at least one carboxyl group. Examples of the first ethylenic unsaturated monomer include without limitation acrylic acid, (meth)acrylic acid, maleic acid, itaconic acid, fumaric acid, and the like, and combinations thereof.

The acrylic-based resin may include the first ethylenic unsaturated monomer in an amount ranging from about 5 to about 50 wt %, for example about 10 to about 40 wt %, based on the total weight of the acrylic-based resin. In some embodiments, the acrylic-based resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt. %. Further, according to some embodiments of the present invention, the amount of the first ethylenic unsaturated monomer can be in a range from any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. They may be used singularly or as a mixture of more than two.

The acrylic-based resin may include the second ethylenic unsaturated monomer in an amount ranging from about 50 to about 95 wt %, for example about 90 to about 60 wt %, based on the total weight of the acrylic-based resin. In some embodiments, the acrylic-based resin may include the second ethylenic unsaturated monomer in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the amount of the second ethylenic unsaturated monomer can be in a range from any of the foregoing amounts to about any other of the foregoing amounts.

Examples of the acrylic-based resin may include without limitation a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like, but are not limited thereto. They may be used singularly or as a mixture of two or more.

The acrylic-based resin may have a weight average molecular weight ranging from about 3,000 to about 150,000 g/mol, for example about 3,000 to about 40,000 g/mol, and as another example about 5,000 to about 30,000 g/mol. When the acrylic-based resin has a weight average molecular weight within these ranges, the photosensitive resin composition can have good physical and chemical properties, appropriate viscosity, and/or close contacting properties (adhesion) with a substrate when used as a light blocking layer.

The acrylic-based resin may have an acid value ranging from about 20 to about 200 mgKOH/g, for example about 50 to about 150 mgKOH/g. When acrylic-based resin has an acid value within these ranges, excellent pixel resolution may be realized.

When the acrylic-based resin is included in the photosensitive resin composition, the cardo-based resin and the acrylic-based resin may be present at a weight ratio of about 99:1 to about 1:99, for example about 95:5 to about 50:50.

In some embodiments, the mixture of the cardo-based resin and the acrylic-based resin may include the cardo-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt. %. Further, according to some embodiments of the present invention, the amount of the cardo-based resin can be in a range from any of the foregoing amounts to about any other of the foregoing amounts.

In some embodiments, the mixture of the cardo-based resin and the acrylic-based resin may include the acrylic-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt. %. Further, according to some embodiments of the present invention, the amount of the acrylic-based resin can be in a range from any of the foregoing amounts to about any other of the foregoing amounts.

When the cardo-based resin and acrylic-based resin are included in amounts within these weight ratios, the photosensitive resin composition may exhibit excellent development properties and sensitivity and may provide a light blocking layer pattern with excellent pattern formation ability while inhibiting the formation of undercuts.

(B) Reactive Unsaturated Compound

The reactive unsaturated compound may be any conventional monomer or oligomer known in the art for use in a photosensitive resin composition. Exemplary reactive unsaturated compounds include without limitation mono-functional and/or multi-functional ester(s) of (meth)acrylic acid including at least one ethylenic unsaturated double bond.

The reactive unsaturated compound can promote sufficient polymerization at exposure during pattern forming processes to form patterns having excellent heat resistance, light resistance, and/or chemical resistance, due to the ethylenic unsaturated double bond.

Examples of the reactive unsaturated compound may include without limitation ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenol A epoxyacrylate, ethyleneglycolmonomethylether acrylate, trimethylolpropane triacrylate, trisacryloyloxyethyl phosphate, and the like, and combinations thereof.

Examples of commercially available reactive unsaturated compounds include without limitation the following compounds. Examples of mono-functional (meth)acrylic acid esters may include without limitation Aronix M-101®, M-111®, M-114® (TOAGOSEI CHEMICAL INDUSTRY CO., LTD.); KAYARAD TC-110S®, TC-120S® (NIPPON KAYAKU CO., LTD.); V-158®, V-2311® (OSAKA ORGANIC CHEMICAL IND., LTD.), and the like. Examples of difunctional (meth)acrylic acid esters may include without limitation Aronix M-210®, M-240®, M-6200® (TOAGOSEI CHEMICAL INDUSTRY CO., LTD.), KAYARAD HDDA®, HX-220®, R-604® (NIPPON KAYAKU CO., LTD.), V-260®, V-312®, V-335 HP® (OSAKA ORGANIC CHEMICAL IND., LTD.), and the like. Examples of tri-functional (meth)acrylic acid esters may include without limitation Aronix M-309®, M-400®, M-405®, M-450®, M-7100®, M-8030®, M-8060® (TOAGOSEI CHEMICAL INDUSTRY CO., LTD.), KAYARAD TMPTA®, DPCA-20®, DPCA-30®, DPCA-60®, DPCA-120® (NIPPON KAYAKU CO., LTD.), V-295®, V-300®, V-360®, V-GPT®, V-3PA®, V-400® (Osaka Yuki Kayaku Kogyo Co. Ltd.), and the like. The reactive unsaturated compounds may be used singularly or as a mixture of two or more.

The reactive unsaturated compound may be treated with acid anhydride to improve development properties.

The photosensitive resin composition may include the reactive unsaturated compound in an amount ranging from about 1 to about 40 wt %, for example about 1 to about 20 wt %, based on the total weight of the photosensitive resin composition. In some embodiments, the photosensitive resin composition may include the reactive unsaturated compound in an amount of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the reactive unsaturated compound can be in a range from any of the foregoing amounts to about any other of the foregoing amounts.

When the reactive unsaturated compound is included in an amount within these ranges, the photosensitive resin composition may exhibit sufficient curing upon exposure during pattern formation processes and a pattern formed thereof may exhibit reliability, heat resistance, light resistance, chemical resistance, resolution and/or close contacting properties (adhesion).

(C) Pigment

The pigment may be an organic pigment, an inorganic pigment, or a combination thereof.

The pigment may include a red pigment, a green pigment, a blue pigment, a yellow pigment, a black pigment, and the like, or a combination thereof.

Examples of the red pigment include without limitation C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment include without limitation halogen-substituted copper phthalocyanine pigments such as C.I. green pigment 36, C.I. green pigment 7, and the like. Examples of the blue pigment include without limitation copper phthalocyanine pigments such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. Examples of the yellow pigment include without limitation isoindoline pigments such as C.I. yellow pigment 139, and the like, quinoptithalone pigments such as C.I. yellow pigment 138, and the like, nickel complex pigments such as C.I. yellow pigment 150, and the like. Examples of the black pigment include without limitation aniline black, perylene black, titanium black, carbon black, and the like. The pigments may be used singularly or as a mixture of two or more and are not limited to the above described pigments.

Among them, in order to implement light blocking of a light blocking layer efficiently, the black pigment may be included. When the black pigment is used, a color calibrating agent such as an anthraquinone-based pigment, perylene-based pigment, phthalocyanine-based pigment, azo-based pigment, and the like, and combinations thereof may be also used.

The photosensitive resin composition may further include a dispersing agent in order to improve dispersion of the pigment. The pigment may be surface-pretreated with a dispersing agent, or the pigment and dispersing agent may be added together during preparation of the photosensitive resin composition.

Examples of the dispersing agent may include without limitation non-ionic dispersing agents, anionic dispersing agents, cationic dispersing agents, and the like, and combinations thereof. Examples of the dispersing agent include without limitation polyalkylene glycol and esters thereof, polyoxyalkylene, polyhydric alcohol ester alkylene oxide addition products, alcohol alkylene oxide addition products, sulfonic acid esters, sulfonates, carboxylic acid esters, carboxylates, alkylamide alkylene oxide addition products, alkyl amines, and the like. The dispersing agents may be used singularly or as a mixture of two or more.

Commercially available examples of the dispersing agent include without limitation: DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like (BYK); EFKA-47, EFKA-47EA, EFKA-48, EFKA-49, EFKA-100, EFKA-400, EFKA-450, and the like (EFKA chemicals); Solsperse 5000, Solsperse 12000, Solsperse 13240, Solsperse 13940, Solsperse 17000, Solsperse 20000, Solsperse 24000GR, Solsperse 27000, Solsperse 28000, and the like (Zeneka); or PB711, PB821, and the like (Ajinomoto).

The photosensitive resin composition may include the dispersing agent in an amount of about 0.1 to about 15 wt %, based on the total weight of the photosensitive resin composition. In some embodiments, the photosensitive resin composition may include the dispersing agent in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, or 15 wt %. Further, according to some embodiments of the present invention, the amount of the dispersing agent can be in a range from any of the foregoing amounts to about any other of the foregoing amounts.

When the dispersing agent is included in an amount within the above ranges, dispersion of the photosensitive resin composition can be improved, which can provide excellent stability, development properties, and/or patterning properties during manufacture of a light blocking layer.

Optionally, the pigment may be pretreated with a water-soluble inorganic salt and a wetting agent. When the pigment is pretreated, it can have a finer primary particle size.

An exemplary pretreatment process includes kneading a pigment with a water-soluble inorganic salt and a wetting agent and filtering and washing the obtained pigment.

The kneading step may be performed at a temperature of about 40 to about 100° C. The filtering and washing process can include washing the inorganic salt using water and the like.

Exemplary water-soluble inorganic salts include without limitation sodium chloride, potassium chloride, and the like, and combinations thereof.

The wetting agent allows the pigment to be uniformly mixed with the inorganic salt and be pulverized. Examples of the wetting agent include without limitation alkylene glycol monoalkyl ethers such as ethylene glycol monoethylether, propylene glycol monomethylether, diethylene glycol monomethylether, and the like; alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The kneaded pigment can have an average particle diameter ranging from about 30 to about 100 nm. When the pigment has an average particle diameter within the above range, a fine pattern may be effectively formed which can also have excellent heat resistance and light resistance.

The photosensitive resin composition may include the pigment in an amount of about 1 to about 30 wt %, for example about 2 to about 20 wt %, based on the total weight of the photosensitive resin composition. In some embodiments, the photosensitive resin composition may include the pigment in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the pigment can be in a range from any of the foregoing amounts to about any other of the foregoing amounts.

When the pigment is included in an amount within the above ranges, color reproducibility, curing capability, and/or close contacting properties of a pattern may be excellent.

(D) Initiator

Exemplary initiators may include without limitation photopolymerization initiators, radical polymerization initiators, and the like, and combinations thereof.

The photopolymerization initiator may be any conventional initiator useful in a photosensitive resin composition. Non-limiting examples of photopolymerization initiators include acetophenone-based compounds, benzophenone-based compounds, thioxanthone-based compounds, benzoin-based compounds, triazine-based compounds, and the like, and combinations thereof.

Exemplary acetophenone-based compounds include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Exemplary benzophenone-based compounds include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Exemplary thioxanthone-based compounds include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Exemplary benzoin-based compounds include without limitation benzoin, benzoin methyl ether, benzoin ethyl ether, benzoin isopropyl ether, benzoin isobutyl ether, benzyldimethylketal, and the like, and combinations thereof.

Exemplary triazine-based compounds include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloro methyl)-s-triazine, bis(trichloromethyl)-6-styryl-s-triazine, 2-(naphto-1-yl)-4,6-bis(trichloromethyl)-s-triazine, 2-(4-methoxynaphto-1-yl)-4,6-bis(trichloromethyl)-s-triazine, 2-4-trichloromethyl(piperonyl)-6-triazine, 2-4-trichloromethyl(4'-methoxystyryl)-6-triazine, and the like, and combinations thereof.

The photopolymerization initiator may further include a carbazole-based compound, a diketone-based compound, a sulfonium borate-based compound, a diazo-based compound, a biimidazole-based compound, and the like, and combinations thereof.

Exemplary radical polymerization initiators may include without limitation peroxide-based compounds, azobis-based compounds, and the like, and combinations thereof.

Exemplary peroxide-based compound include without limitation ketone peroxides such as methylethylketone peroxide, methylisobutylketone peroxide, cyclohexanone peroxide, methylcyclohexanone peroxide, acetylacetone peroxide, and the like; diacyl peroxides such as isobutyryl peroxide, 2,4-dichlorobenzoyl peroxide, o-methylbenzoyl peroxide, bis-3,5,5-trimethylhexanoyl peroxide, and the like; hydro peroxides such as 2,4,4,-trimethylpentyl-2-hydro peroxide, diisopropylbenzenehydro peroxide, cumenehydro peroxide, t-butylhydro peroxide, and the like; dialkyl peroxides such as dicumyl peroxide, 2,5-dimethyl-2,5-di(t-butylperoxy)hexane, 1,3-bis(t-butyloxyisopropyl)benzene, t-butylperoxyvaleric acid n-butylester, and the like; alkyl peresters such as 2,4,4-trimethylpentyl peroxyphenoxyacetate, α-cumyl peroxyneodecanoate, t-butyl peroxybenzoate, di-t-butyl peroxytrimethyladipate, and the like; percarbonates such as di-3-methoxybutyl peroxydicarbonate, di-2-ethylhexyl peroxydicarbonate, bis-4-t-butylcyclohexyl peroxydicarbonate, diisopropyl peroxydicarbonate, acetyicyclohexylsulfonyl peroxide, t-butyl peroxyarylcarbonate, and the like, and combinations thereof.

Exemplary azobis-based compounds include without limitation 1,1'-azobiscyclohexane-1-carbonitrile, 2,2'-azobis(2,4-dimethylvaleronitrile), 2,2,-azobis(methylisobutyrate), 2,2'-azobis(4-methoxy-2,4-dimethylvaleronitrile), α,α'-azobis(isobutylnitrile) and 4,4'-azobis(4-cyanovaleric acid), and the like, and combinations thereof.

Since the initiator absorbs light and is excited and then transmits energy, it may be used with a photo-sensitizer causing a chemical reaction.

Exemplary photo-sensitizers include without limitation tetraethylene glycol bis-3-mercapto propionate, pentaerythritol tetrakis-3-mercapto propionate, dipentaerythritol tetrakis-3-mercapto propionate, and the like, and combinations thereof.

The photosensitive resin composition may include the initiator in an amount of about 0.01 wt % to about 10 wt %, for example about 0.1 to about 5 wt %, based on the total weight of the photosensitive resin composition. In some embodiments, the photosensitive resin composition may include the initiator in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the initiator can be in a range from any of the foregoing amounts to about any other of the foregoing amounts.

When the initiator is included in an amount within these ranges, the photosensitive resin composition may exhibit sufficient curing upon exposure during pattern forming processes to provide excellent reliability, heat resistance, light resistance, chemical resistance, resolution and/or close contacting properties with minimal or nodeteriorated transmittance due to non-reacting initiators.

(E) Solvent

The solvent is compatible with the cardo-based resin, reactive unsaturated compound, pigment, and initiator but is not reactive therewith.

Exemplary solvents may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-oxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate; ketonic acid esters such as ethyl pyruvate; and the like, and combinations thereof. Furthermore, the solvent may be N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like. These solvents may be used singularly or in a combination.

In various embodiments, taking into account compatibility and reactivity, exemplary solvents can include without limitation glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol methylether acetate, propylene glycol propylether acetate, and the like, and combinations thereof.

The solvent is used in a balance amount, for example about 50 to about 90 wt %, based on the total weight of the photosensitive resin composition. In some embodiments, the solvent can used in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of solvent can be in a range from any of the foregoing amounts to about any other of the foregoing amounts.

When the solvent is included in an amount within these ranges, the photosensitive resin composition may have an appropriate viscosity which can improve processibiity of a light blocking layer.

(F) Other Additive(s)

The photosensitive resin composition may further include one or more additives, such as an epoxy compound to improve close contacting (adhesive) properties with a substrate.

Examples of the epoxy compound include without limitation phenol novolac epoxy compounds, tetramethyl biphenyl epoxy compounds, bisphenol A epoxy compounds, alicyclic epoxy compounds, and the like, and combinations thereof.

The photosensitive resin composition may include the epoxy compound in an amount of about 0.01 to about 20 parts by weight, for example about 0.1 to about 10 parts by weight, based on 100 parts by weight of the photosensitive resin composition. In some embodiments, the photosensitive resin composition may include the epoxy compound in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, or 20 parts by weight. Further, according to some embodiments of the present invention, the amount of the epoxy compound can be in a range from any of the foregoing amounts to about any other of the foregoing amounts.

When the epoxy compound is included in an amount within the above ranges, the photosensitive resin composition may exhibit improved close contacting properties, storage properties, and the like.

The photosensitive resin composition may further include a silane coupling agent having a reactive substituent such as a carboxyl group, a methacryloyl group, an isocyanate group, an epoxy group, and the like in order to improve adherence to a substrate.

Examples of the silane coupling agent include without limitation trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl) ethyltrimethoxysilane, and the like. The silane coupling agent may be used singularly or as a mixture of two or more.

The photosensitive resin composition may include the silane coupling agent in an amount of about 0.01 to about 10 parts by weight, based on 100 parts by weight of the photosensitive resin composition. In some embodiments, the photosensitive resin composition may include the silane coupling agent in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 parts by weight. Further, according to some embodiments of the present invention, the amount of the silane coupling agent can be in a range from any of the foregoing amounts to about any other of the foregoing amounts.

When the silane coupling agent is included in an amount within the above ranges, the photosensitive resin composition may exhibit improved close contacting properties, storage properties, and the like.

The photosensitive resin composition may further include a surfactant in order to improve coating properties and inhibit spots.

Examples of the surfactant may include without limitation fluorine-based surfactants, for example, BM-1000®, and BM-1100® (BM Chemie Inc.); MEGAFACE F 142D®, F 172®, F 173®, and F 183® DAINIPPON INK & CHEMICALS(DIC), Inc.); FULORAD FC-135®, FULORAD FC-170C®, FULORAD FC-430®, and FULORAD FC-431® (SUMITOMO 3M CO., LTD.); SURFLON S-112®, SURFLON S-113®, SURFLON S-131®, SURFLON S-141®, and SURFLON S-145® (ASAHI GLASS CO., LTD.); and SH-28PA®, SH-190®, SH-193®, SZ-6032®, and SF-8428®(TORAY SILICONE CO., LTD.); and the like, and combinations thereof.

The photosensitive resin composition may include the surfactant in an amount of about 0.001 to about 5 parts by weight, based on 100 parts by weight of the photosensitive resin composition. In some embodiments, the photosensitive resin composition may include the surfactant in an amount of about 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 parts by weight. Further, according to some embodiments of the present invention, the amount of the surfactant can be in a range from any of the foregoing amounts to about any other of the foregoing amounts.

When the surfactant is included in an amount within these ranges, coating uniformity may be ensured, stains may not be generated, and wetting properties for a glass substrate can be improved.

The photosensitive resin composition may further include other additives such as but not limited to antioxidants, stabilizers, and the like. The other additives can be used in conventional amounts so long as they do not adversely affect the desired properties of the photosensitive resin composition.

According to another embodiment, a light blocking layer manufactured using the photosensitive resin composition is provided. The light blocking layer may be manufactured as follows.

(1) Application and Film Formation

The aforementioned photosensitive resin composition can be coated to have a desired thickness, for example, a thickness ranging from about 0.5 to about 25 μm, on a substrate which undergoes a predetermined pretreatment, using any suitable method, such as but not limited to a spin or slit coating method, a roll coating method, a screen-printing method, an applicator method, and the like. Then, the coated substrate can be heated at a temperature ranging from about 70 to about 110° C. for about 1 to about 10 minutes to remove a solvent.

(2) Exposure

The resultant film can be exposed to radiation having a wavelength of about 190 to about 500 nm after positioning a mask with a predetermined shape to form a desired pattern. The radiation exposure can be performed using a light source such as a low pressure mercury lamp, a high pressure mercury lamp, an ultra high pressure mercury lamp, a metal halide lamp, an argon gas laser, and the like. However, other sources of radiation may be used, such as but not limited to X rays, electron beams, and the like.

An exemplary exposure step can use, for example, a light dose of about 500 mJ/cm$^2$ or less (with a 365 nm sensor) when a high pressure mercury lamp is used. However, the light dose may vary depending on the types and amounts of components of the photosensitive resin composition and dry film thickness. The light dose can be readily determined by the skilled artisan without undue experimentation.

(3) Development

After the exposure process, an alkali aqueous solution can be used to develop the exposed film by dissolving and removing non-exposed parts of the film, thereby leaving the exposed part to form an image pattern.

(4) Post-Treatment

The developed image pattern may be cured, for example by heating or again exposing to radiation, to provide a pattern with excellent heat resistance, photo resistance, close contacting properties, crack-resistance, chemical resistance, high strength, and/or storage stability, among other possible properties.

Therefore, the aforementioned photosensitive resin composition may provide excellent insulation and optical density required for a light blocking layer.

Hereinafter, the present invention is illustrated in more detail with reference to examples. However, these are exemplary embodiments of present invention and are not limiting.

PREPARATION EXAMPLE 1-1

Preparation of Cardo-Based Resin (1) 138 g of 9,9'-bis(4-glycyloxyphenyl)fluorene (HEAR CHEM.), 54 g of acrylic acid, 1.4 g of benzyltriethylammonium chloride (DAEJUNG CHEMICAL & METALS Co., Ltd.), 1 g of triphenylphosphine (Aldrich, Inc.), 128 g of propylene glycol methyl ether acetate (Daicel Chemical Ind., Ltd.), and 0.5 g of hydroquinone are placed in a reactor, heated to 120° C., and maintained at the same temperature for 3 hours to synthesize the compound of the following Chemical Formula 7-1.

[Chemical Formula 7-1]

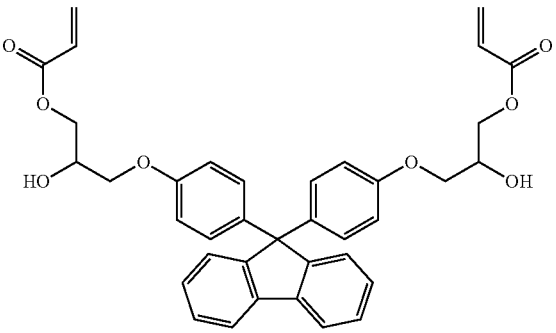

(2) 60 g of the compound represented by the above Chemical Formula 7-1, 11 g of biphenyltetracarboxylic acid dianhydride (Mitsubishi Gas), 3 g of tetrahydrophthal anhydride (Aldrich, Inc.), 20 g of propylene glycol methyl ether acetate (Daicel Chemical Ind., Ltd.) and 0.1 g of N,N'-tetramethylammonium chloride are placed in a reactor, heated to 120° C., and maintained at the same temperature for 2 hours to synthesize the compound represented by the following Chemical Formula 7-2. The compound represented by Chemical Formula 7-2 has a weight average molecular weight of 5,400 g/mol.

[Chemical Formula 7-2]

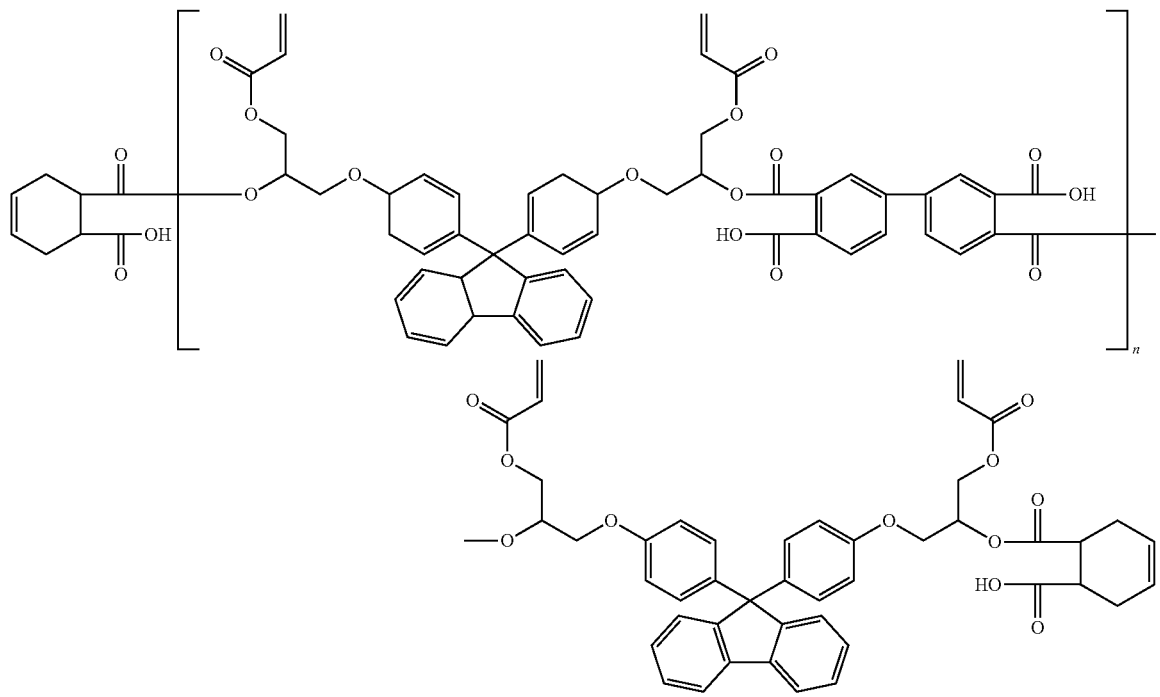

(3) 75 g of the compound of the above Chemical Formula 7-2, 10 g of glycidyl methacrylate, and 0.4 g of triphenylphosphine (Aldrich, Inc.) are placed into a reactor, heated to 100° C., and maintained at the same temperature for 3 hours to synthesize the compound of the following Chemical Formula 7-3. The compound represented by Chemical Formula 7-3 has a weight average molecular weight of 5,600 g/mol.

[Chemical Formula 7-3]

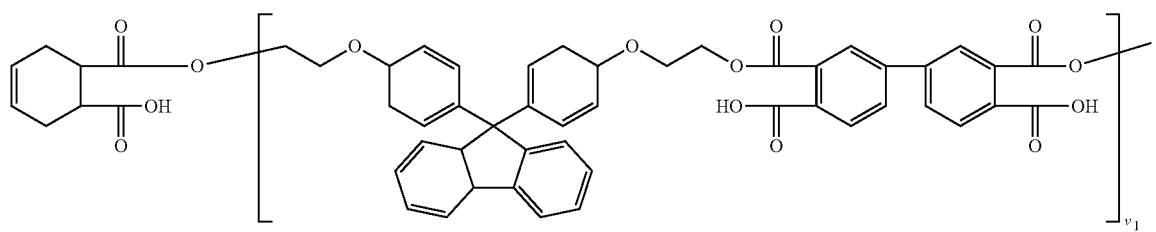

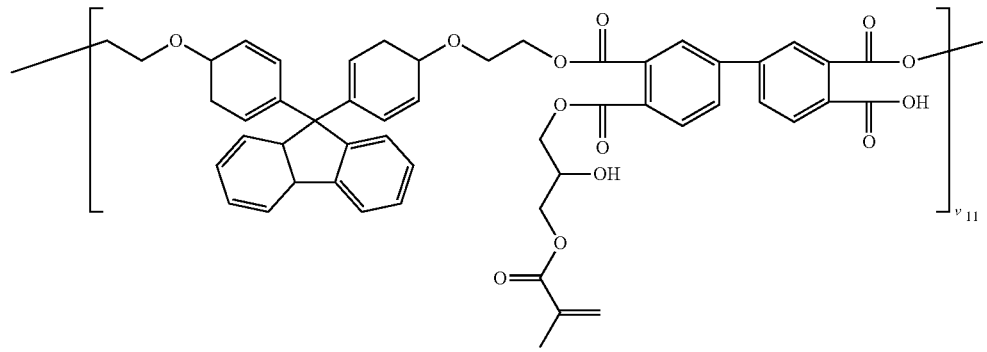

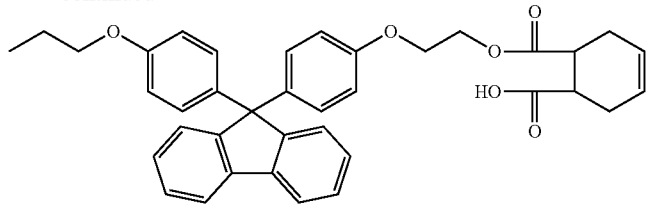

In Chemical Formula 7-3, $n^1:n^{11}$ is 60:40.

PREPARATION EXAMPLE 1-2

Preparation of Cardo-Based Resin 60 g of the compound of the above Chemical Formula 7-1, 11 g of benzophenonetetracarboxylic acid dianhydride (Mitsubishi Gas), 3 g of tetrahydrophthal anhydride (Aldrich, Inc.), and 20 g of propylene glycol methyl ether acetate (Daicel Chemical Ind., Ltd.) are placed into a reactor, heated to 120° C., and maintained at maintained at the same temperature for 2 hours to synthesize the compound of the following Chemical Formula 7-4. The compound represented by Chemical Formula 7-4 has a weight average molecular weight of 5,300 g/mol.

[Chemical Formula 7-4]

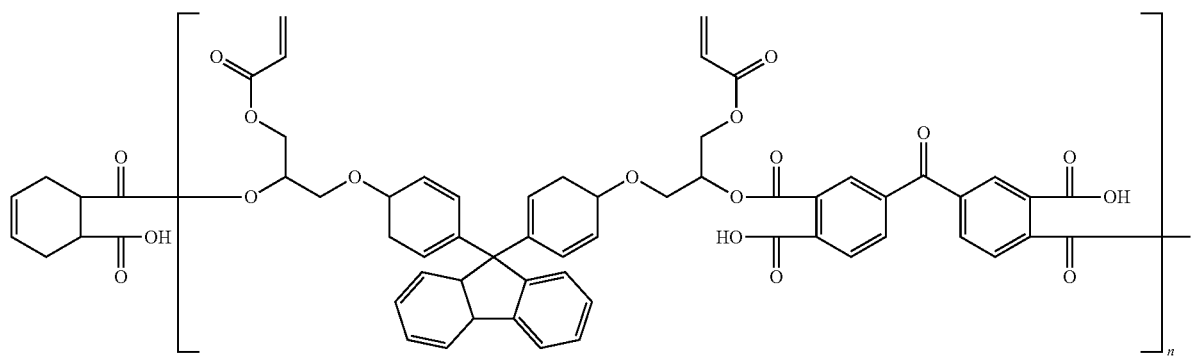

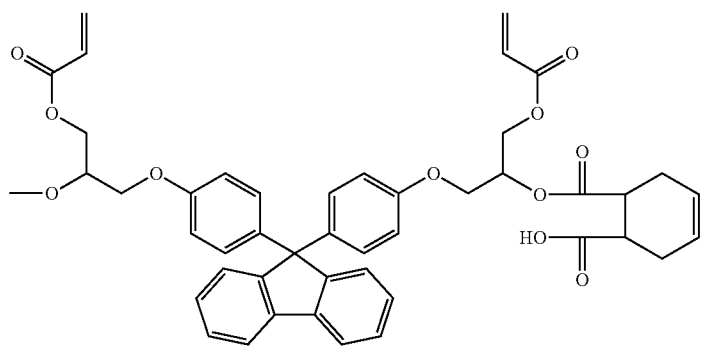

PREPARATION EXAMPLE 1-3

Preparation of Cardo-Based Resin 70 g of the compound of the following Chemical Formula 7-5, BPEF (HEAR CHEM), 30 g of benzophenonetetracarboxylic acid dianhydride (Mitsubishi Gas) 30 g, 7.5 g of tetrahydrophthal anhydride (Aldrich, Inc.), and 70 g of propylene glycol methyl ether acetate (Daicel Chemical Ind., Ltd.) are placed into a reactor, heated to 120° C., and maintained at the same temperature for 2 hours. Then 13 g of glycidyl methacrylate and 0.4 g of triphenylphosphine (Aldrich, Inc.) are placed into the reactor, heated to 100° C., and maintained at the same temperature for 3 hours to synthesize the compound of the following Chemical Formula 7-6. The compound represented by Chemical Formula 7-6 has a weight average molecular weight of 5,300 g/mol.

[Chemical Formula 7-5]

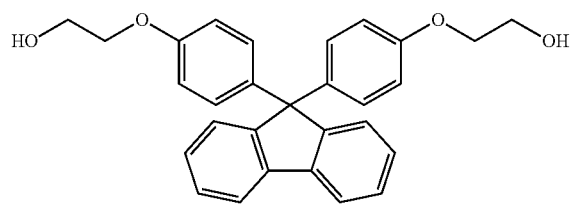

[Chemical Formula 7-6]

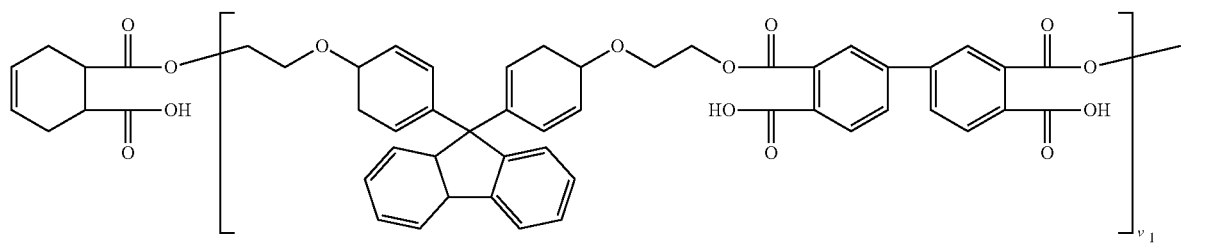

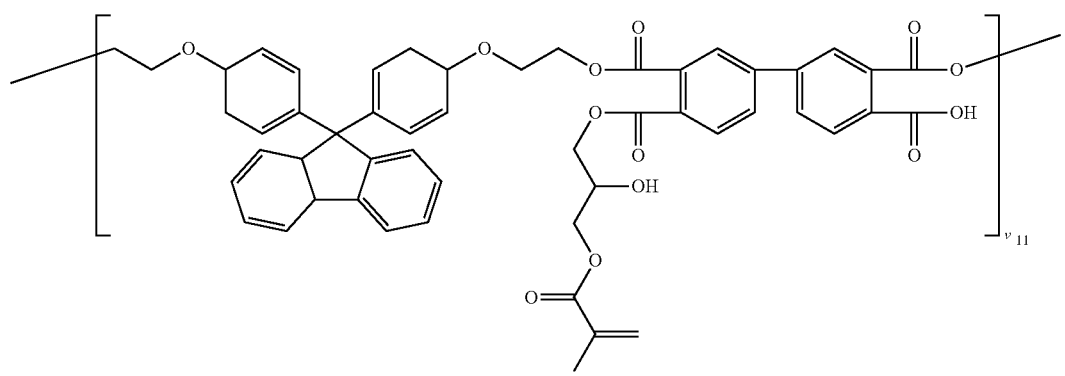

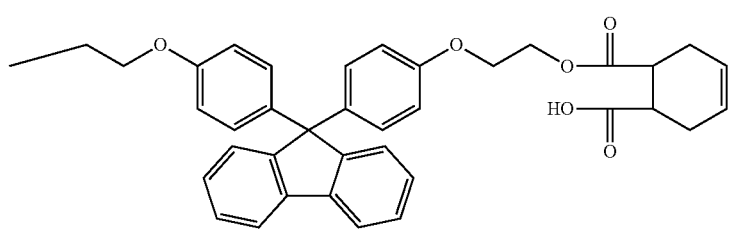

In Chemical Formula 7-6, $v^1:v^{11}$ is 60:40.

PREPARATION EXAMPLE 2

Preparation of Red Pigment Dispersion 15 g of a C.I. red pigment 254 (Ciba-Geigy Ltd.), 4 g of DISPERBYK-163 (BYK Additives & Instruments), 3 g of an acrylic acid/benzylmethacrylate copolymer (Miwon Commercial Co, Ltd., NPR8000), and 78 g of propylene glycol methyl ether acetate are mixed in a reactor. The mixture is dispersed for 12 hours using a paint-shaker (Asada Iron Works Co., Ltd.) to prepare a red pigment dispersion solution.

PREPARATION EXAMPLE 3

Preparation of Black Pigment Dispersion 15 g of carbon black (Cabot Co.), 4 g of DISPERBYK-163 (BYK Additives & Instruments), 3 g of an acrylic acid/benzylmethacrylate copolymer (NPR8000, Miwon Commercial Co, Ltd.), and 78 g of propylene glycol methyl ether acetate are placed in a reactor. The mixture is dispersed for 12 hours by using a paint-shaker (Asada Iron Works Co., Ltd.) to prepare a black pigment dispersion solution.

EXAMPLES 1 AND 2 AND COMPARATIVE EXAMPLES 1 TO 6

Preparation of Photosensitive Resin Composition

Each photosensitive resin composition according to Examples 1 and 2 and Comparative Examples 1 to 6 is prepared to include the following components in the amounts set forth in the following Table 1.

In particular, an initiator is dissolved in a solvent. The solution is agitated at room temperature for 2 hours. Then, a binder resin and a reactive unsaturated compound are added to the solution. The mixture is agitated at room temperature for 2 hours. Next, the red pigment dispersion solution according to Preparation Example 1 or the black pigment dispersion solution according to Preparation Example 2 and a silane coupling agent are added to the reactant. The resulting mixture is agitated at room temperature for one hour. Then, the product is filtered three times to remove impurities and prepare a photosensitive resin composition.

(A) Binder Resin
(A-1) The compound represented by Chemical Formula 7-3 according to Preparation Example 1-1 is used as a cardo-based resin.
(A-2) The compound represented by Chemical Formula 7-4 according to Preparation Example 1-2 is used as a cardo-based resin.
(A-3) The compound represented by Chemical Formula 7-6 according to Preparation Example 1-3 is used as a cardo-based resin.
(A-4) V259ME available from Nippon Steel Chemical Co. is used as a cardo-based resin.
(B) Reactive Unsaturated Compound
Dipentaerythritol hexaacrylate is used.
(C) Pigment Dispersion
(C-1) The red pigment dispersion solution according to Preparation Example 2 is used. The red pigment dispersion solution includes 15 wt % pigment solids, based on the total weight of the red pigment dispersion solution.
(C-2) The black pigment dispersion solution according to Preparation Example 3 is used. The black pigment dispersion solution includes 15 wt % pigment solids, based on the total weight of the black pigment dispersion solution.
(D) Initiator
IRGACURE OXE02 available from Ciba Geigy Ltd. is used.
(E) Solvent
Propylene glycol methylether acetate is used.
(F) Additive
γ-Glycidoxy propyl trimethoxysilane (S-510, Chisso Co.) is used as a silane coupling agent.

TABLE 1

| | | Examples | | Comparative Examples | | | | | |
|---|---|---|---|---|---|---|---|---|---|
| | | 1 | 2 | 1 | 2 | 3 | 4 | 5 | 6 |
| (A) Binder | (A-1, wt %) | 9.5 | 9.5 | — | — | — | — | — | — |
| resin | (A-2, wt %) | — | — | 9.5 | 9.5 | — | — | — | — |
| (solid 50% | (A-3, wt %) | — | — | — | — | 9.5 | 9.5 | — | — |
| reduced) | (A-4, wt %) | — | — | — | — | — | — | 9.5 | 9.5 |
| (B) Reactive unsaturated compound (wt %) | | 3.5 | 3.5 | 3.5 | 3.5 | 3.5 | 3.5 | 3.5 | 3.5 |
| (C) Pigment Dispersion | (C-1, wt %) | 40 6* | — | 40 6* | — | 40 6* | — | 40 6* | — |
| | (C-2, wt %) | — | 40 6* | — | 40 6* | — | 40 6* | — | 40 6* |
| (D) Initiator (wt %) | | 0.3 | 0.8 | 0.3 | 0.8 | 0.3 | 0.8 | 0.3 | 0.8 |
| (E) Solvent (wt %) | | 44.2 | 43.7 | 44.2 | 43.7 | 44.2 | 43.7 | 44.2 | 43.7 |
| (F) Additive (wt %) | | 2.5 | 2.5 | 2.5 | 2.5 | 2.5 | 2.5 | 2.5 | 2.5 |

The mark * indicates the amount of a pigment solid based on the total weight of a (C-1) red pigment dispersion solution or a (C-2) black pigment dispersion solution.

Evaluation 1: Development Property

Each photosensitive resin composition according to Examples 1 and 2 and Comparative Example 1 to 6 is coated on a silicon wafer (LG Siltron) at a thickness of 0.8 μm with a spin coater (KDNS, K-Spin8) and exposed for 350 ms with an exposer (Nikon, I10C). Then, when the exposed products are developed with a 0.2 wt % tetramethylammonium hydroxide (TMAH) aqueous solution by using a developer (SSP-200, SVS Corp.). The development property is evaluated with reference to the time difference between when the aqueous solution is coated and when the coated films started to be developed. The results are provided in the following Table 2.

<Development Property Evaluation>

○: less than 20 seconds

Δ: more than 20 seconds and less than 30 seconds

×: more than 30 seconds

Evaluation 2: Residue

Each photosensitive resin composition according to Examples 1 and 2 and

Comparative Example 1 to 6 is coated on a silicon wafer (LG Siltron) at a thickness of 0.8 μm with a spin coater (KDNS, K-Spin8) and exposed for 350 ms with an exposer (Nikon, I10C). Then, the exposed films are developed with a 0.2 wt % tetramethylammonium hydroxide (TMAH) aqueous solution using a developer (SSP-200, SVS Corp.) to form a pattern. Then, the patterns are examined to determine the presence of any residue using a CD scanning electron microscope analyzer (8100XP, KLA-Tencor Co.). The results are provided in the following Table 2. In addition, FIGS. 1 to 3 are CD scanning electron microscope photographs of the developed films evaluated to determine the presence of residue.

Figure 2:
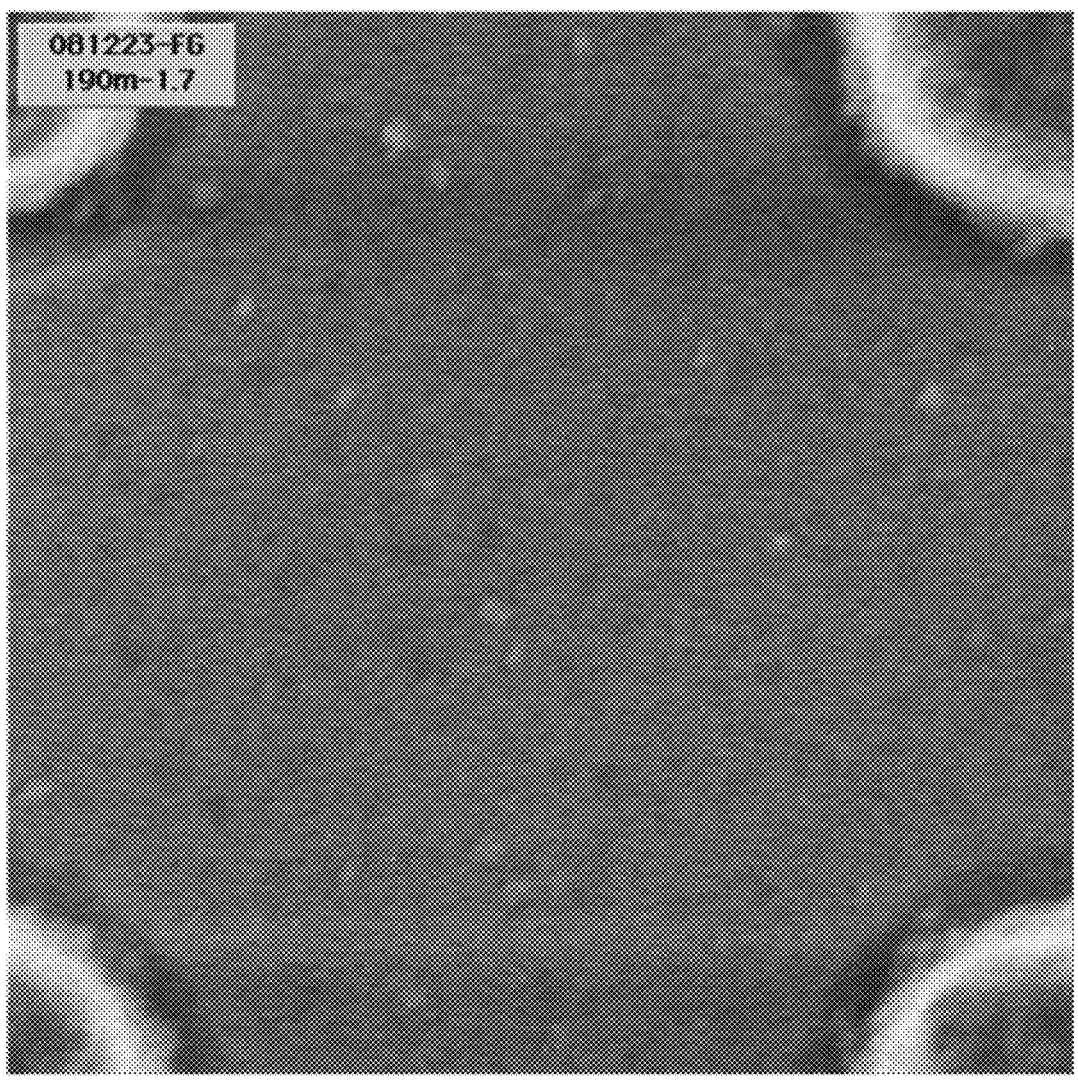
FIG. 2 is a scanning electron microscope photograph showing residue of the photosensitive resin composition according to Comparative Example 4.
Figure 3:
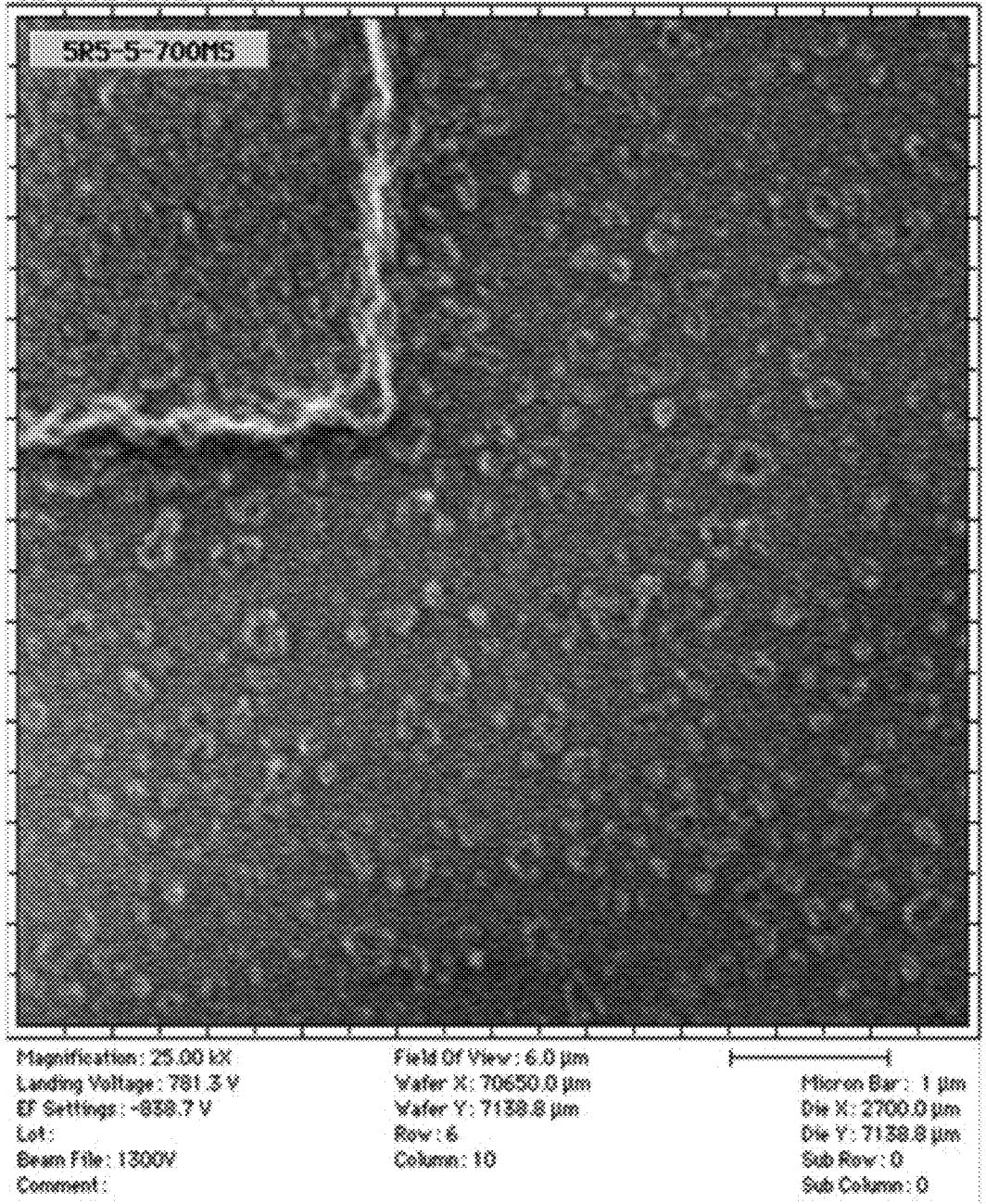
FIG. 3 is a scanning electron microscope photograph showing residue of the photosensitive resin composition according to Comparative Example 1.

FIG. 1 is a scanning electron microscope photograph showing residue of the photosensitive resin composition according to Example 1, FIG. 2 is a scanning electron microscope photograph showing residue of the photosensitive resin composition according to Comparative Example 4, and FIG. 3 is a scanning electron microscope photograph showing residue of the photosensitive resin composition according to Comparative Example 1

<Residue Evaluation>

○: smooth pattern as shown in FIG. 1

Δ: a small amount of residue as shown in FIG. 2

×: a large amount of residue as shown in FIG. 3

Referring to FIGS. 1 to 3, the photosensitive resin composition according to Example 1 has a smooth surface with no residue. The photosensitive resin compositions according to Comparative Examples 1 and 4 have a residue.

Evaluation 3: Pattern-Forming Property

The photosensitive resin compositions according to Examples 1 and 2 and Comparative Examples 1 to 4 are coated to a height of 1.5 μm on a glass substrate using a spin coater and then exposed to a light for 45 mJ/cm² using a pattern mask and an exposer (USHIO Inc.). The coated glass is developed with an aqueous solution diluted with 1 wt % potassium hydroxide at 23° C. for 1 minute and then cleaned with pure water for 1 minute. The 1.5 um-high pattern is heated by curing in a 220° C. oven for 30 minutes. The cured pattern is examined to determine the shape thereof using a scanning electron microscope. The results are provided in the following Table 2 and FIGS. 4 to 6.

Figure 4:
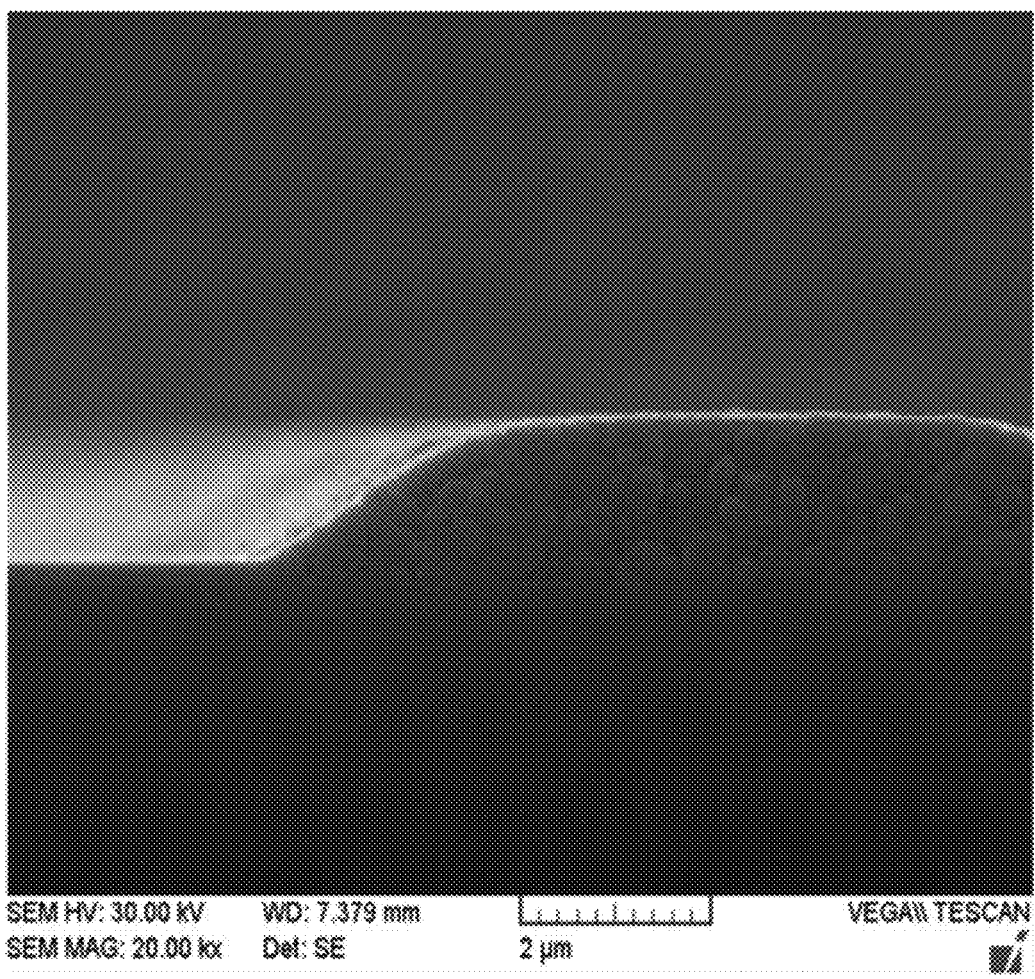
FIG. 4 is a scanning electron microscope photograph showing the pattern-forming property of the photosensitive resin composition according to Example 1.
Figure 5:
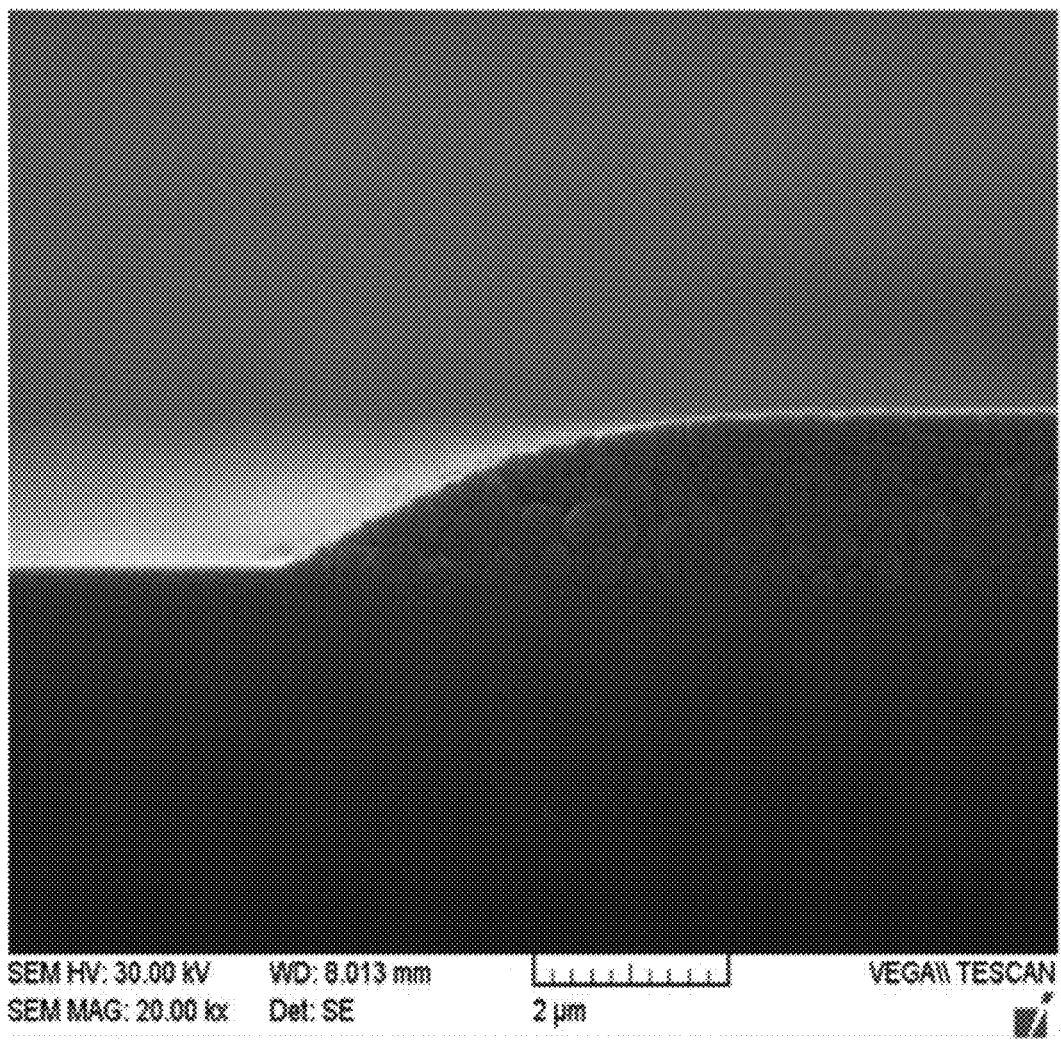
FIG. 5 is a scanning electron microscope photograph showing the pattern-forming property of the photosensitive resin composition according to Comparative Example 1.
Figure 6:
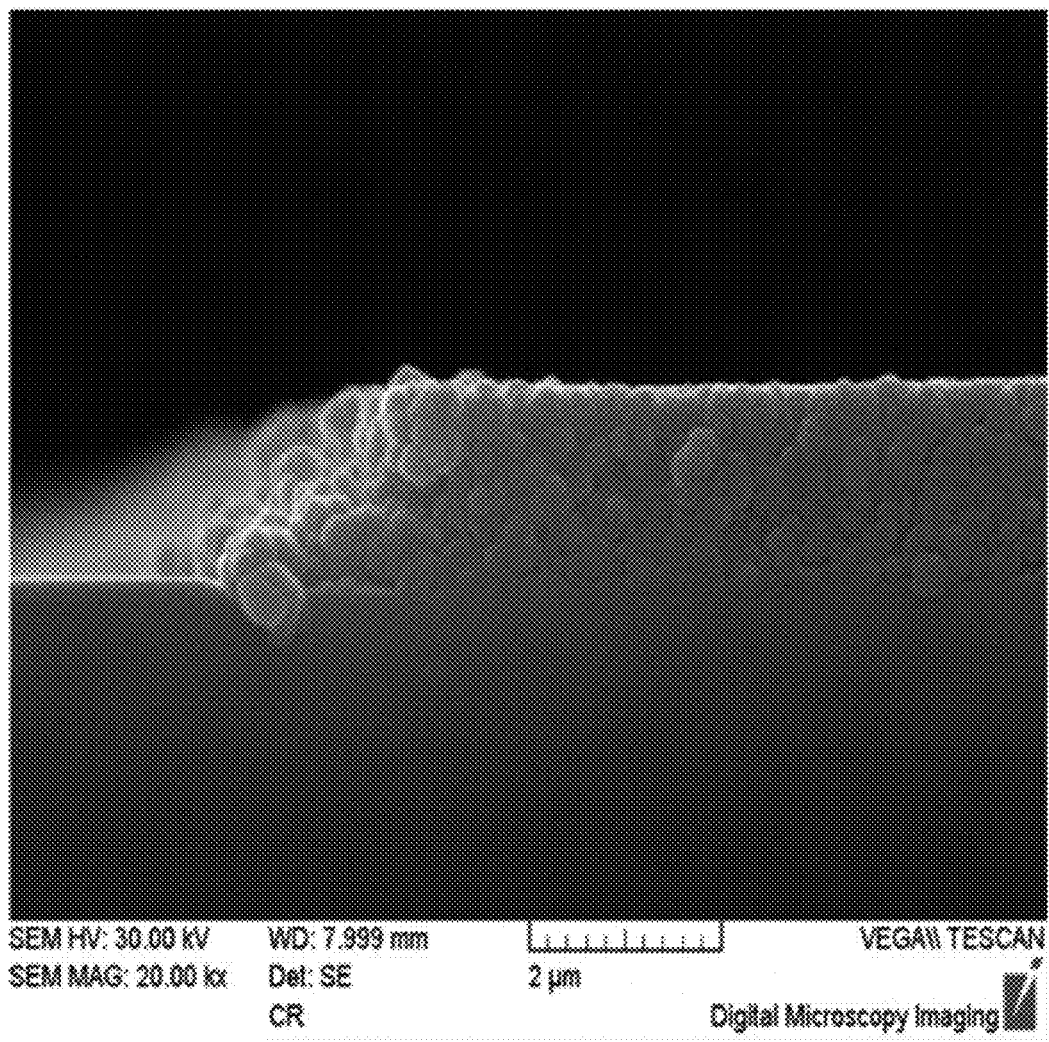
FIG. 6 is a scanning electron microscope photograph showing the pattern-forming property of the photosensitive resin composition according to Comparative Example 2.

FIG. 4 is a scanning electron microscope photograph showing the pattern-forming property of the photosensitive resin composition according to Example 1, FIG. 5 is a scanning electron microscope photograph showing the pattern-forming property of the photosensitive resin composition according to Comparative Example 1, and FIG. 6 is a scanning electron microscope photograph showing the pattern-forming property of the photosensitive resin composition according to Comparative Example 2.

<Pattern-Forming Property>

◎: excellent pattern-forming property as shown in FIG. 4

○: good pattern-forming property as shown in FIG. 5

Δ: bad pattern-forming property as shown in FIG. 6

Referring to FIGS. 4 to 6, the photosensitive resin composition according to Example 1 forms an excellent pattern, while the photosensitive resin composition according to Comparative Example 2 did not have a good pattern.

Evaluation 4: Fine Line Pattern-Forming Property Evaluation

The photosensitive resin compositions according to Example 2 and Comparative Examples 2 and 4 using a black pigment dispersion are used to form a pattern under the same conditions as used to determine the pattern-forming property. The patterns are examined to evaluate minimum size using an optical microscope. The results are provided in FIGS. 7 to 9.

Figure 7:
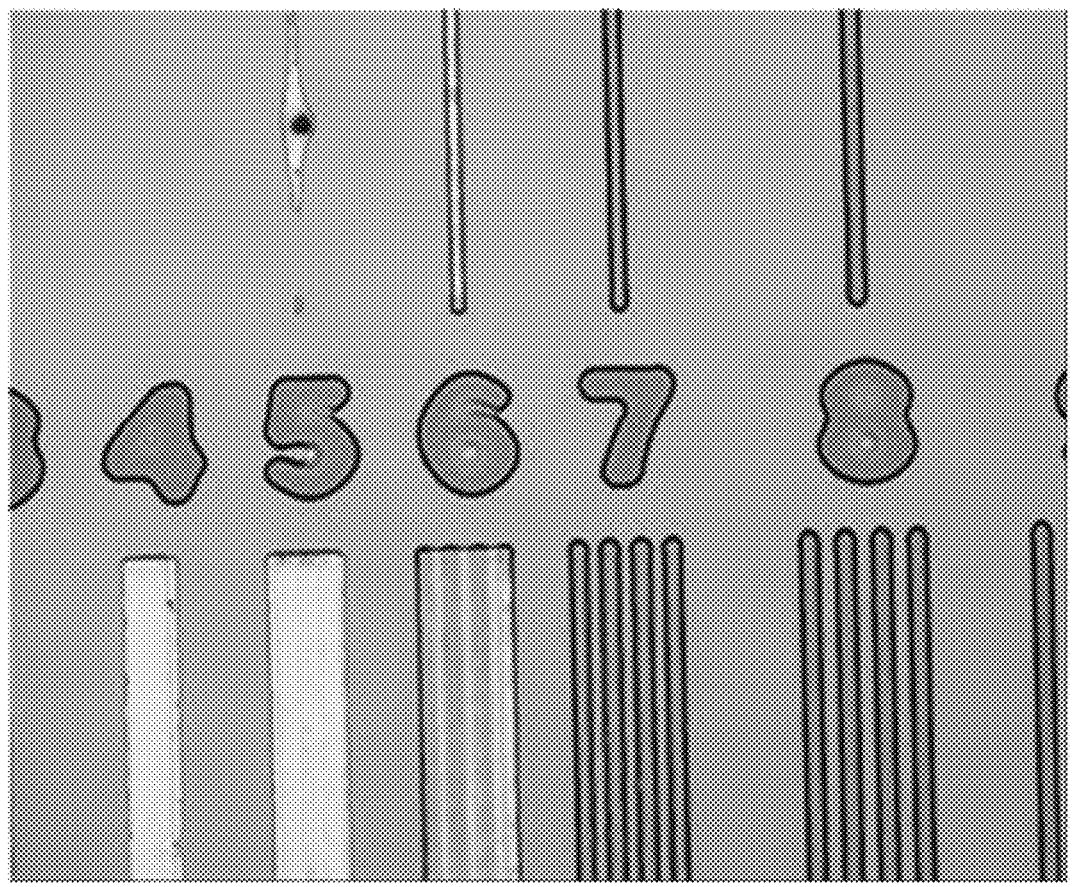
FIG. 7 is a scanning electron microscope photograph showing the pattern size of the photosensitive resin composition according to Example 2.
Figure 8:
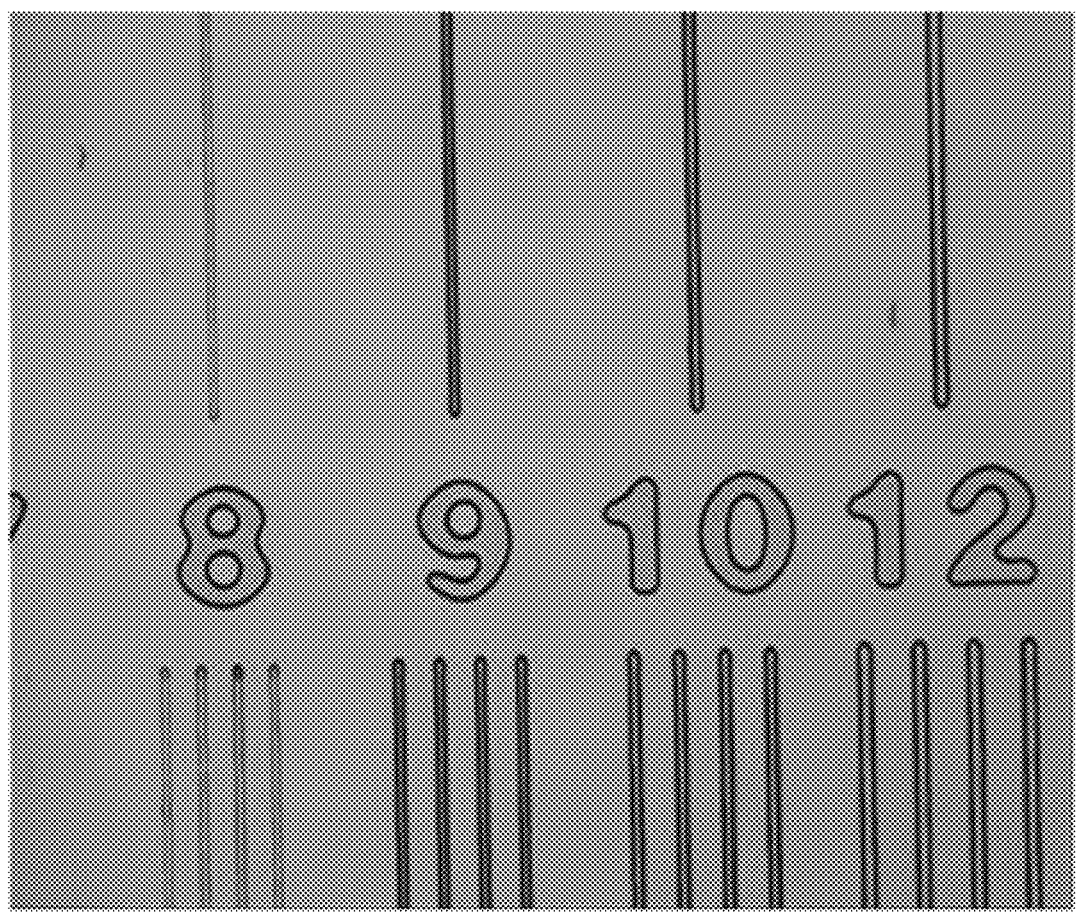
FIG. 8 is an optical microscope photograph showing the pattern size of the photosensitive resin composition according to Comparative Example 2.
Figure 9:
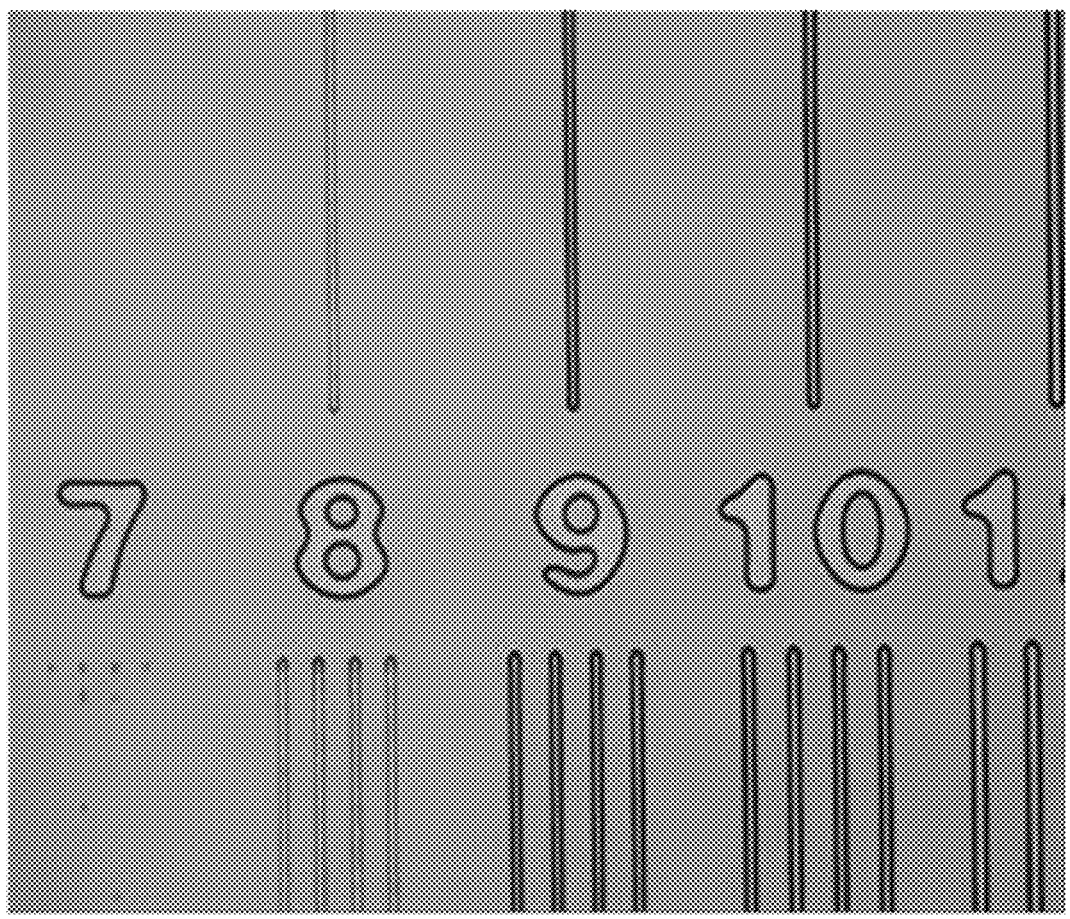
FIG. 9 is an optical microscope photograph showing the pattern size of the photosensitive resin composition according to Comparative Example 4.

FIG. 7 is a scanning electron microscope photograph showing a pattern size of the photosensitive resin composition according to Example 2, FIG. 8 is an optical microscope photograph showing a pattern size of the photosensitive resin composition according to Comparative Example 2, and FIG. 9 is an optical microscope photograph showing a pattern size of the photosensitive resin composition according to Comparative Example 4.

Referring to FIGS. 7 to 9, the photosensitive resin composition according to Example 2 has a minimum pattern size of 7 μm, while those according to Comparative Examples 2 and 4 have a minimum pattern size of 9 μm.

TABLE 2

|  | Development property | Residue | Pattern-forming property | Minimum pattern size (μm) |
| --- | --- | --- | --- | --- |
| Example 1 | ○ | ○ | ◎ | — |
| Example 2 | ○ | ○ | ◎ | 7 |
| Comparative Example 1 | Δ | X | ○ | — |
| Comparative Example 2 | Δ | ○ | Δ | 9 |
| Comparative Example 3 | Δ | X | ○ | — |
| Comparative Example 4 | Δ | Δ | ○ | 9 |
| Comparative Example 5 | Δ | Δ | Δ | — |
| Comparative Example 6 | Δ | ○ | ○ | — |

Referring to Table 2, the photosensitive resin composition according to Examples 1 and 2 using the cardo-based resin according to one embodiment exhibit excellent development properties, residue, and pattern-forming properties compared with those according to Comparative Examples 1 to 6 using a cardo-based resin with a different structure from the cardo-based resin used in Examples 1 and 2.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition comprising:
   (A) a cardo-based resin including repeating units represented by the following Chemical Formulae 1 and 2;
   (B) a reactive unsaturated compound;
   (C) a pigment;
   (D) an initiator; and
   (E) a solvent:

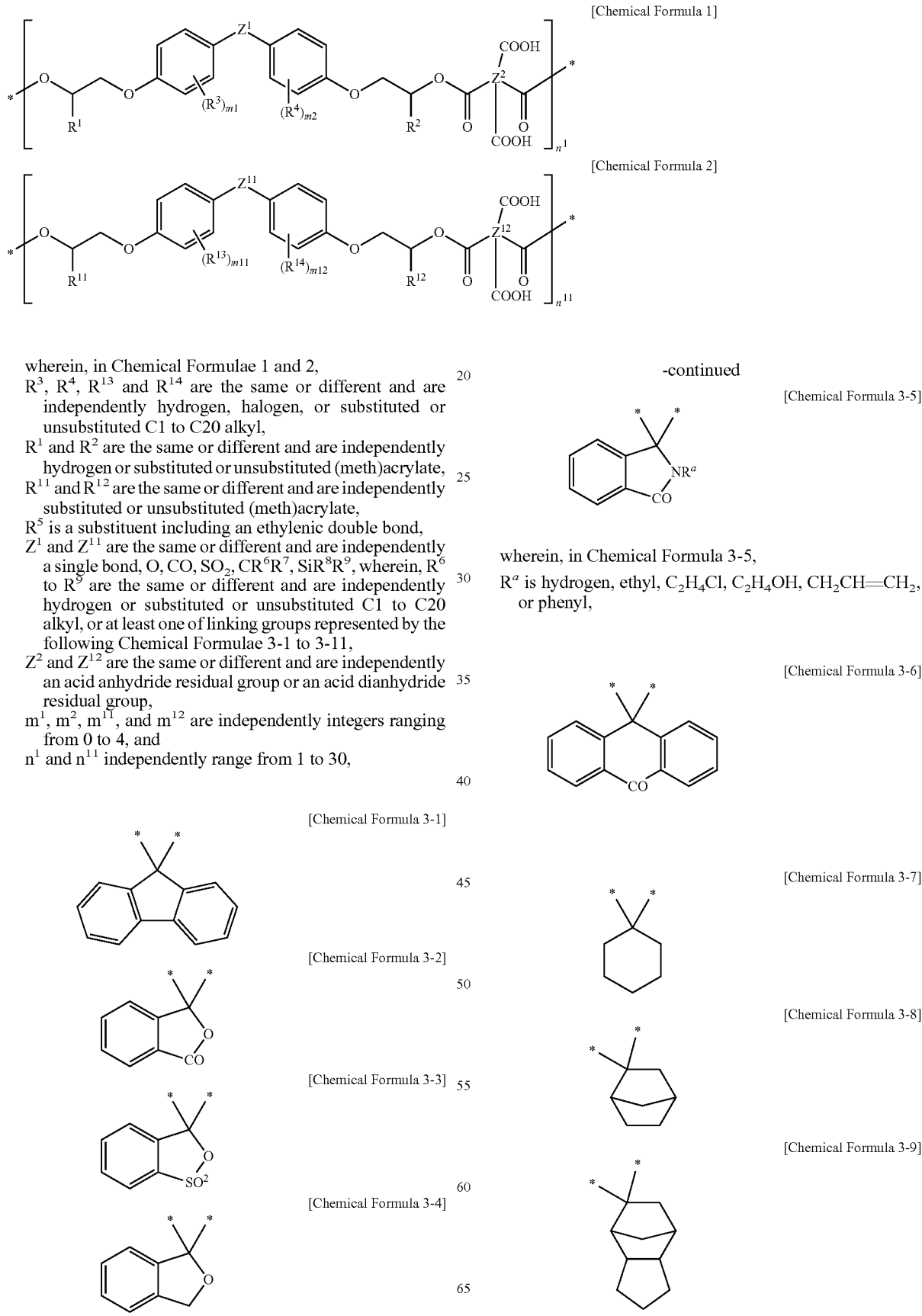

wherein, in Chemical Formulae 1 and 2, $R^3$, $R^4$, $R^{13}$ and $R^{14}$ are the same or different and are independently hydrogen, halogen, or substituted or unsubstituted C1 to C20 alkyl, $R^1$ and $R^2$ are the same or different and are independently hydrogen or substituted or unsubstituted (meth)acrylate, $R^{11}$ and $R^{12}$ are the same or different and are independently substituted or unsubstituted (meth)acrylate, $R^5$ is a substituent including an ethylenic double bond, $Z^1$ and $Z^{11}$ are the same or different and are independently a single bond, O, CO, $SO_2$, $CR^6R^7$, $SiR^8R^9$, wherein, $R^6$ to $R^9$ are the same or different and are independently hydrogen or substituted or unsubstituted C1 to C20 alkyl, or at least one of linking groups represented by the following Chemical Formulae 3-1 to 3-11, $Z^2$ and $Z^{12}$ are the same or different and are independently an acid anhydride residual group or an acid dianhydride residual group, $m^1$, $m^2$, $m^{11}$, and $m^{12}$ are independently integers ranging from 0 to 4, and $n^1$ and $n^{11}$ independently range from 1 to 30, wherein, in Chemical Formula 3-5, $R^a$ is hydrogen, ethyl, $C_2H_4Cl$, $C_2H_4OH$, $CH_2CH\!=\!CH_2$, or phenyl, -continued

[Chemical Formula 3-10]

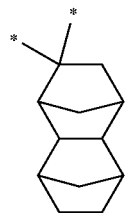

[Chemical Formula 3-11]

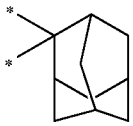

wherein, in Chemical Formula 2, $R^5$ is a substituent represented by the following Chemical Formula 4-1 or 4-2,

[Chemical Formula 4-1]

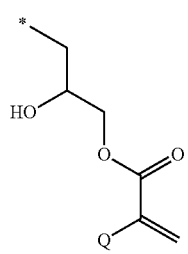

wherein, in Chemical Formula 4-1,

Q is hydrogen or substituted or unsubstituted C1 to C20 alkyl, and

[Chemical Formula 4-2]

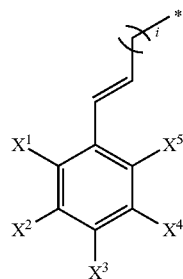

wherein, in Chemical Formula 4-2, $X^1$ to $X^5$ are the same or different and are independently hydrogen, halogen, substituted or unsubstituted C1 to C20 alkyl, substituted or unsubstituted C6 to C30 aryl, substituted or unsubstituted amine, or substituted or unsubstituted C1 to C20 alkoxy, and i is an integer ranging from 0 to 5.

2. The photosensitive resin composition of claim 1, wherein n1 of the repeating unit represented by Chemical Formula 1 and n11 of the repeating unit represented by Chemical Formula 2 are present at a mole ratio of about 1:99 to about 99:1.

3. The photosensitive resin composition of claim 1, wherein the cardo-based resin has a weight average molecular weight of about 500 to about 50,000 g/mol.

4. The photosensitive resin composition of claim 1, wherein at least one of the terminal ends of the cardo-based resin comprises a terminal group represented by the following Chemical Formula 5:

[Chemical Formula 5]

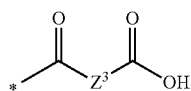

wherein, in above Chemical Formula 5,

Z3 is at least one of linking groups represented by the following Chemical Formulae 6-1 to 6-7,

[Chemical Formula 6-1]

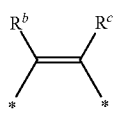

wherein, in Chemical Formula 6-1, Rb and Rc are the same or different and are independently hydrogen, substituted or unsubstituted C1 to C20 alkyl, an ester group, or an ether group,

[Chemical Formula 6-2]

[Chemical Formula 6-3]

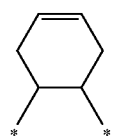

[Chemical Formula 6-4]

[Chemical Formula 6-5]

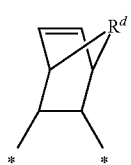

wherein, in Chemical Formula 6-5, Rd is O, S, NH, substituted or unsubstituted C1 to C20 alkyl, C1 to C20 alkylamine, or C2 to C20 allylamine,

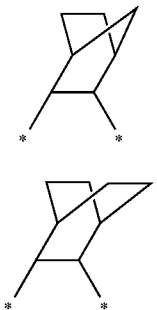

[Chemical Formula 6-6]

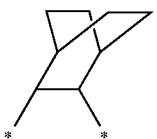

[Chemical Formula 6-7]

5. The photosensitive resin composition of claim 1, wherein the photosensitive resin composition comprises
about 1 to about 30 wt % of the cardo-based resin (A);
about 1 to about 40 wt % of the reactive unsaturated compound (B);
about 1 to about 30 wt % of the pigment (C);
about 0.01 to about 10 wt % of the initiator (D); and
balance of the solvent (E).

6. The photosensitive resin composition of claim 1, wherein the photosensitive resin composition further comprises an acrylic-based resin.

7. The photosensitive resin composition of claim 6, wherein the acrylic-based resin comprises a copolymer of a first ethylenic unsaturated monomer comprising at least one carboxyl group; and a second ethylenic unsaturated monomer comprising an aromatic vinyl compound, unsaturated carboxylic acid ester compound, unsaturated carboxylic acid amino alkyl ester compound, carboxylic acid vinyl ester compound, unsaturated carboxylic acid glycidyl ester compound, vinyl cyanide compound, unsaturated amide compound, or a combination thereof.

8. The photosensitive resin composition of claim 7, wherein the first ethylenic unsaturated monomer comprises acrylic acid, methacrylic acid, maleic acid, itaconic acid, fumaric acid, or a combination thereof; and the second ethylenic unsaturated monomer comprises styrene, α-methylstyrene, vinyltoluene, vinylbenzylmethylether, methyl methacrylate, methyl acrylate ethyl methacrylate, ethyl acrylate, butyl methacrylate, butyl acrylate, 2- hydroxyethyl methacrylate, 2-hydroxyethyl acrylate, 2-hydroxy butyl methacrylate, 2-hydroxy butyl acrylate, benzyl methacrylate, benzyl acrylate, cyclohexyl methacrylate, cyclohexyl acrylate, phenyl methacrylate, phenyl acrylate, 2-aminoethyl methacrylate, 2-aminoethyl acrylate, 2-dimethylaminoethyl methacrylate, 2-dimethylaminoethyl acrylate, vinyl acetate, vinyl benzoate, glycidyl methacrylate, glycidyl acrylate, methacrylonitrile, acrylonitrile, methacrylamide, acrylamide, or a combination thereof.

9. The photosensitive resin composition of claim 6, wherein the acrylic-based resin has a weight average molecular weight of about 3,000 to about 40,000 g/mol.

10. The photosensitive resin composition of claim 6, wherein the cardo-based resin and the acrylic-based resin are included at a weight ratio of about 99:1 to about 30:70.

11. The photosensitive resin composition of claim 1, wherein the initiator comprises a photopolymerization initiator, a radical polymerization initiator, or a combination thereof.

12. The photosensitive resin composition of claim 1, wherein the photosensitive resin composition comprises about 0.01 to about 20 parts by weight of an epoxy compound, based on 100 parts by weight of the photosensitive resin composition.

13. A light blocking layer manufactured using the photosensitive resin composition according to claim 1.

* * * * *

UNITED STATES PATENT AND TRADEMARK OFFICE
CERTIFICATE OF CORRECTION

PATENT NO. : 8,273,270 B2
APPLICATION NO. : 13/161542
DATED : September 25, 2012
INVENTOR(S) : Chang-Min Lee et al.

It is certified that error appears in the above-identified patent and that said Letters Patent is hereby corrected as shown below:

Column 16, Line 9 reads: "quinoptithalone pigments such as C.I. yellow pigment 139, and the like,"
and should read: "quinophthalone pigments such as C.I. yellow pigment 139, and the like,"
Column 18, Line 47 reads: "peroxydicarbonate, diisopropyl peroxydicarbonate, acetyicyclohexy-"
and should read: "peroxydicarbonate, diisopropyl peroxydicarbonate, acetylcyclohexy-"
In the Claims
Column 33, Claim 1, Chemical Formula 2 is depicted as:

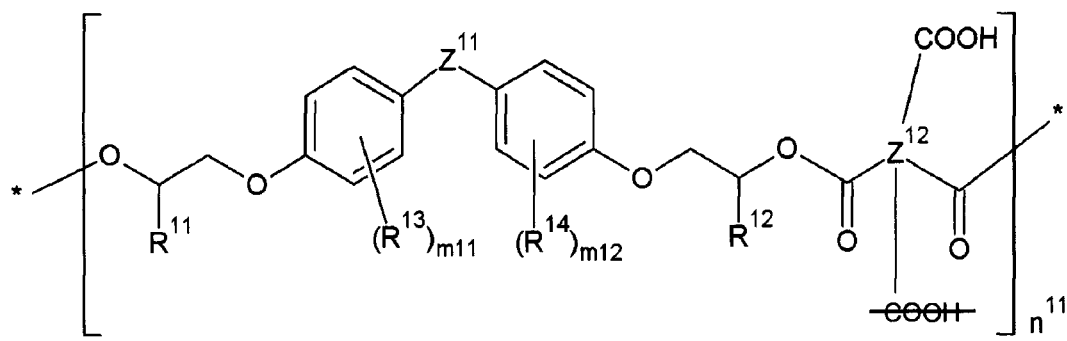

and should be depicted as:

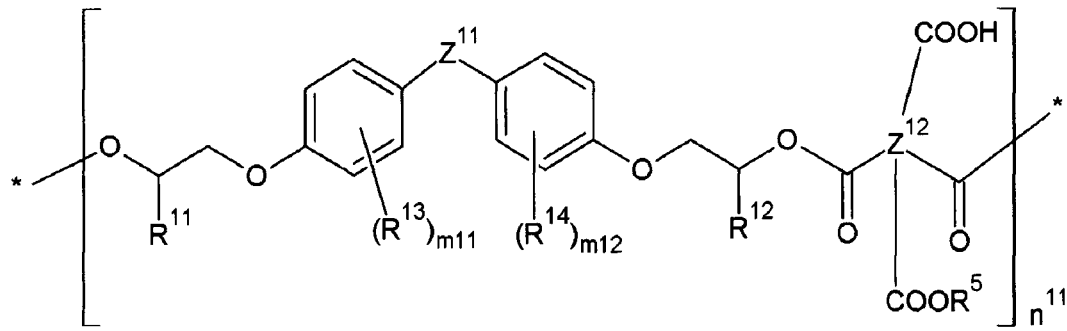

Signed and Sealed this
Fifth Day of February, 2013

Teresa Stanek Rea
*Acting Director of the United States Patent and Trademark Office*